(12) United States Patent
Ameen Beshari et al.

(10) Patent No.: US 12,237,023 B2
(45) Date of Patent: Feb. 25, 2025

(54) DYNAMIC DETECTION AND DYNAMIC ADJUSTMENT OF SUB-THRESHOLD SWING IN A MEMORY CELL SENSING CIRCUIT

(71) Applicant: Intel NDTM US LLC, Santa Clara, CA (US)

(72) Inventors: Tarek Ahmed Ameen Beshari, Santa Clara, CA (US); Shantanu R. Rajwade, Santa Clara, CA (US); Matin Amani, Fremont, CA (US); Narayanan Ramanan, San Jose, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 884 days.

(21) Appl. No.: 17/134,010

(22) Filed: Dec. 24, 2020

(65) Prior Publication Data

US 2022/0208286 A1  Jun. 30, 2022

(51) Int. Cl.
*G11C 16/00* (2006.01)
*G11C 16/08* (2006.01)
(Continued)

(52) U.S. Cl.
CPC .......... *G11C 16/3459* (2013.01); *G11C 16/08* (2013.01); *G11C 16/10* (2013.01); *G11C 16/26* (2013.01); *G11C 16/30* (2013.01)

(58) Field of Classification Search
CPC ..... G11C 16/0483; G11C 16/08; G11C 16/10; G11C 16/26; G11C 16/30; G11C 16/3459; G11C 2211/5621; G11C 16/3404; G11C 5/145; G11C 16/04; G11C 16/3427; G11C 16/3454; G11C 16/34; G11C 11/5642;
(Continued)

(56) References Cited

U.S. PATENT DOCUMENTS 8,482,975 B2 * 7/2013 Chandrasekhar ...... G11C 16/10
 365/185.02
10,832,766 B2 11/2020 Khakifirooz et al.
(Continued)

OTHER PUBLICATIONS

European First Office Action, (EP Exam Report Article 94(3) EPC), for Patent Application No. 21197014.0, Mailed Jan. 18, 2024, 5 pages.
(Continued)

*Primary Examiner* — Thong Q Le
(74) *Attorney, Agent, or Firm* — Compass IP Law PC

(57) ABSTRACT

For a nonvolatile (NV) storage media such as NAND media that is written by a program and program verify operation, the system can determine an expected number of SSPC (selective slow programming convergence) cells for a page of cells for specific conditions of the page. The system can perform program verify with a first wordline (WL) select voltage for SSPC cell detection for a first write of the page to detect the expected number of SSPC cells. Based on the determined expected number of SSPC cells, the system can set a boost voltage to capture an expected number of SSPC cells during the program verify operation. The system performs program verify for subsequent writes to the page with a higher WL select voltage, to perform program verify for standard cells and then SSPC program verify with the boost voltage determined from the first write.

21 Claims, 13 Drawing Sheets

(51) Int. Cl.
*G11C 16/10* (2006.01)
*G11C 16/26* (2006.01)
*G11C 16/30* (2006.01)
*G11C 16/34* (2006.01)

(58) Field of Classification Search
CPC ......... G11C 11/413; G11C 5/063; G11C 8/08; G11C 16/3418; G11C 7/1051; G11C 7/1078; G11C 7/01
See application file for complete search history.

(56) References Cited

U.S. PATENT DOCUMENTS

| | | |
|---|---|---|
| 2011/0080789 A1 | 4/2011 | Kalavade et al. |
| 2016/0042791 A1 | 2/2016 | Sakui |
| 2017/0076816 A1 | 3/2017 | Srinivasan |
| 2018/0190347 A1 | 7/2018 | Raghunathan et al. |

OTHER PUBLICATIONS

Extended European Search Report for Patent Application No. 21197014.0, Mailed Feb. 16, 2022, 8 pages.

* cited by examiner

DYNAMIC DETECTION AND DYNAMIC ADJUSTMENT OF SUB-THRESHOLD SWING IN A MEMORY CELL SENSING CIRCUIT

FIELD

Descriptions are generally related to memory cells, and more particular descriptions are related to sub-threshold swing in a memory cell sensing circuit.

BACKGROUND

To increase bit density in memory devices or storage device, the arrays can be arranged as three-dimensional (3D) memory arrays with bit cells in vertical stacks. Traditional arrays are planar, with bit cells arranged in horizontal planes. The 3D devices can include vertical stacks of horizontal planes. Vertical stacking can increase the bit density per unit of integrated circuit area because the cells can be formed around vertical channels instead of only around a horizontal channel.

3D NAND memory arrays program data in a page by giving a sequence of pulses that inject a charge in the memory cells. Each program pulse is typically followed by a series of program verify pulses to check that each cell has trapped the desired amount of charge. Once a cell passes the verify corresponding to the desired programming level of the cell, the controller inhibits it from additional charge injections for subsequent pulses.

Some cells program faster than other cells on the string, which can cause them to trap more charge. The additional charge causes the cells to be in state of higher charge than other cells, which results in the cells charging even faster on a subsequent program pulse. Thus, the cells tend to trap more charge, widening the distribution of threshold voltage (Vt) with each subsequent program.

Selective slow programming convergence (SSPC) allows the programming to modulate the bitline voltage to limit how much charge is injected in cells detected to be close to passing. The limit on the charge can effectively create a weaker pulse for the SSPC cells. Detection of the cells that should be treated as SSPC cells depends on the subthreshold slope (SS), which depends on the position of the wordline in the string, operating temperature, and amount of program/erase stress previously experienced by the cell.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, for a nonvolatile (NV) storage media such as NAND media that is written by a program and program verify operation, the system can determine an expected number of SSPC (selective slow programming convergence) cells for a page of cells for specific conditions of the page. The system can perform SSPC detection based on subthreshold slope (SS) of the cells. In contrast to conventional approaches, which only add temperature detection without being able to account for dependence on array position and cycling, SS depends on the position of the wordline in the string, operating temperature, and amount of program/erase stress previously experienced by the cell. Thus, detecting SSPC with SS can improve detection and enable easier adjustment to the operation of the device relative to traditional approaches using large trim space a lot of tuning and degrade write performance.

The system can perform program verify with a first wordline (WL) select voltage for SSPC cell detection for a first write of the page to detect the expected number of SSPC cells. Based on the determined expected number of SSPC cells, the system can set a boost voltage to capture an expected number of SSPC cells during the program verify operation. The system performs program verify for subsequent writes to the page with a higher WL select voltage, to perform program verify for standard cells and then SSPC program verify with the boost voltage determined from the first write.

In one example, a boost circuit generates the boost voltage. Generation of the boost voltage can include generation of a sequence of SSPC boost voltages to determine the appropriate boost voltage to capture approximately the expected number of SSPC cells. Thus, the system can efficiently detect the subthreshold swing dynamically and set the dependent trims to values that will detect the expected number of SSPC cells. The dynamic detection and setting the sensing to capture the correct number of cells significantly improves level placement throughout the life of the NAND device. The improved level placement results in better endurance or faster performance or a combination of better endurance and faster performance in 3D NAND memories.

Figure 1:
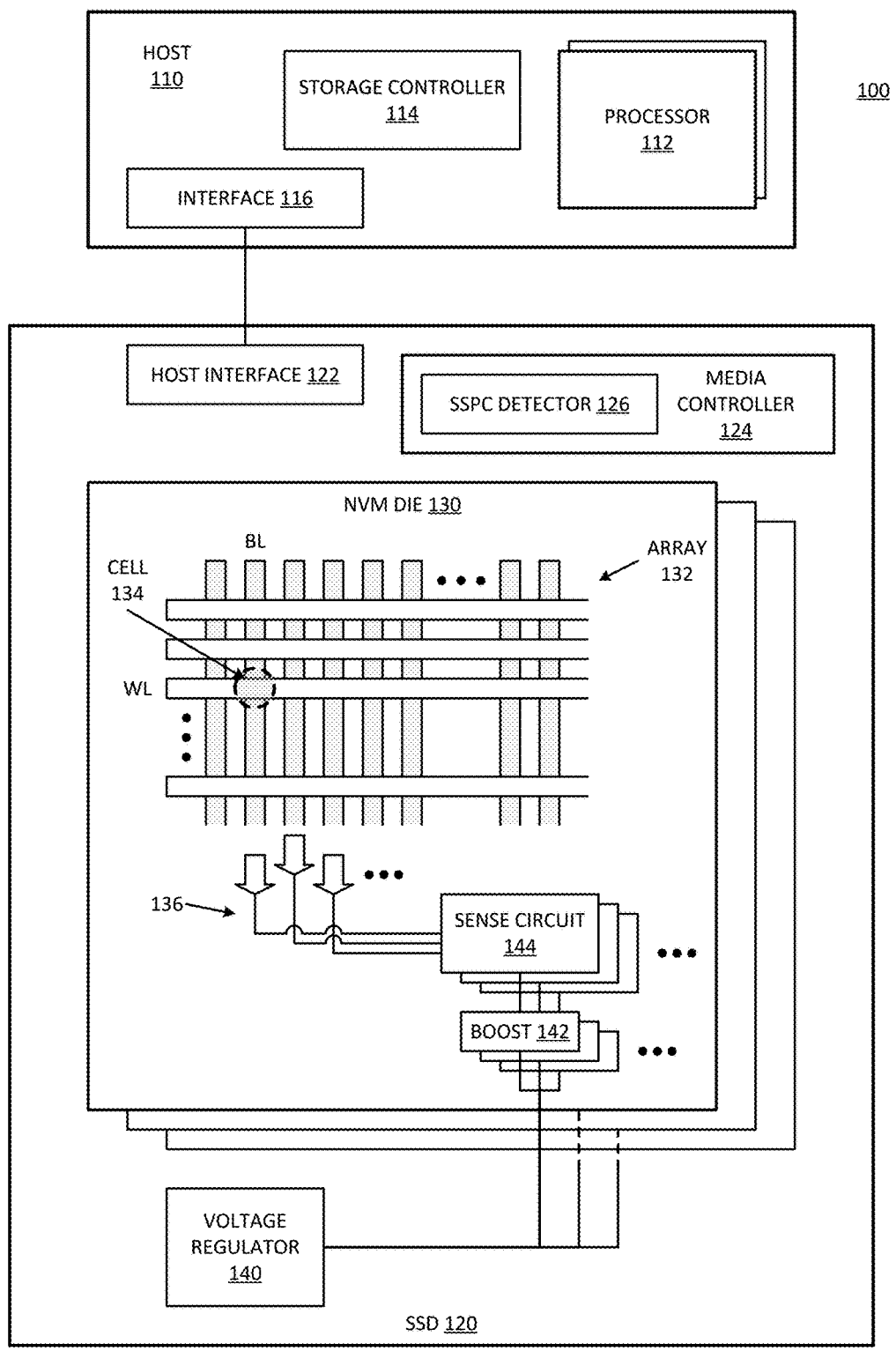
FIG. 1 is a block diagram of an example of a memory that senses a cell with a sense circuit that performs program verify based on SSPC detection.

FIG. 1 is a block diagram of an example of a memory that senses a cell with a sense circuit that performs program verify based on SSPC detection. System 100 includes host 110 coupled to solid-state drive (SSD) 120. Host 110 represents a computing system platform that stores data in SSD 120. SSD 120 represents a storage device for system 100. The computing system platform can be, for example, a laptop or other computer, a gaming system, a tablet or other handheld system, or other computing system.

Host 110 includes processor 112, which represents a host processor or primary processor for the computing device of system 100. Processor 112 can be any type of processor, such as central processing unit (CPU) system on a chip (SOC), a graphics processing unit (GPU), or other processor or controller that performs operations that trigger access to the storage resource on SSD 120.

Host 110 includes interface 116, which represents an interface to access SSD 120. Interface 116 can include hardware such as signal lines, driver, receivers, or other hardware to communicate with SSD 120. SSD 120 includes host interface 122 to communicate with host 110. In one example, interface 116 and host interface 122 can communicate via a Nonvolatile Memory Express (NVMe) standard. NVMe standards define a register level interface for host software to communicate with an SSD over Peripheral Component Interconnect Express (PCIe), a high-speed serial computer expansion bus. NVM Express standards are available at www.nvmexpress.org. PCIe standards are available at pcisig.com.

In one example, host 110 includes storage controller 114, which represents a host-side controller to manage access by the host to SSD 120. Storage controller 114 can manage interface 116 to enable host 110 to communicate with SSD 120. Storage controller 114 receives requests from processor 112 or another component on host 110 for data stored on SSD 120. The request can be a read request to access data at a specific location, or a write or program request to send data to SSD 120 for storage.

In one example, SSD 120 includes media controller 124, which represent a storage-side controller to manage host interface 122 and generate internal operations to respond to requests from host 110. Media controller 124 represents a controller for the SSD device itself, and can control access to NVM (nonvolatile memory) die 130.

In one example, NVM die 130 represents a three-dimensional (3D) NAND memory, such as a 3D NAND flash device. NVM die 130 is nonvolatile memory, which maintains a determinate state even if power is interrupted to the memory device.

NVM die 130 includes array 132, which represents an array of cells 134. In one example, SSD 120 includes multiple NVM dies 130. Array 132 includes wordlines (WLs) and bitlines (BLs). For a 3D storage device, array 132 includes multiple layers of WLs in a 3D stack, and can include BLs in the 3D stack, with channels that extend vertically through the stacks. Cell 134 represents a storage node or storage location at the intersection of a BL and a WL. The WLs can be charged in response to a row address and the BLs can be charged in response to a column address. Cell 134 represents the multiple cells at the intersections of the various WLs and BLs, which can be referred to as bitcells, storage cells, or memory cells.

The arrows at the bottom of the BLs represent output lines 136 to the sense circuits. When the BL and the WL are selected, the charge from the cell is provided on output line 136 to sense circuit 144. Sense circuit 144 represents a circuit that determines the value stored in the cell, such as a zero or one for a single level cell (SLC), or such as a voltage level for a multilevel cell (e.g., triple level cell (TLC) or quad level cell (QLC)).

The programmable unit of array 132 is a page, which is accessible by selecting a wordline. In one example each cell 134 of array 132 stores a binary number of bits (n) by storing one of $2^n$ voltage levels or levels of charge. For example, a QLC cell stores 4 bit per cells, which requires 16 distinguishable programming levels. Programming includes a series of programing pulses applied to selected wordlines to inject electrons in the charge storage portion of the cell (e.g., charge trap or floating gate).

A program pulse is followed by a series of verifies or verify pulses or program verify (PV) pulses, which effectively read the cell to detect if the cell has reached its desired programming level. If the cell has not reached the desired programming level, it should remain selected for programming (to inject more charge); otherwise, it will be inhibited for subsequent program pulses. Inhibiting the cell can include shutting down the bitline to select gate junction to inhibit additional programing.

In one example, media controller 124 includes SSPC detector 126. SSPC detector 126 can detect cells 134 that are close to passing the verify and may widen the distribution of a programming level, which could cause interference by overlapping with the voltage window of an adjacent programming level. In response to detecting SSPC cells, media controller 124 can adjust operation of the programming sequence to trigger the cells with an SSPC voltage, to allow the cells to reach the desired programming level and be inhibited before completing programming on other cells for the same programming level. In one example, media controller 124 controls the application of a boost voltage or controls the bitline voltage to limit the amount of charge injected in the next pulse. The SSPC cells can thus be triggered with a lower voltage, resulting in a weaker injection of charge.

In one example, media controller 124 uses SSPC detector 126 to detect the ideal setup for SSPC during the first pulse that has cells passing the PV of the first level (PV_L1). In one example, SSPC detector 126 performs an operation that is like a PV, which detects cells that are placed above (PV_L1−GS/2), wherein PV_L1 refers to the first level program verify, and GS refers to a gate step or a voltage step or voltage differential between subsequent PV pulses. Thus, in one example, cells with a Vt (voltage threshold) or a voltage that triggers a read of the cell, which are within half the PV increment voltage (GS/2) of PV_L1 (i.e., cells that have Vt between (PV_L1−GS/2) and (PV_L1) should ideally be detected as SSPC cells. Media controller 124 includes one or more counters to track the number of cells SSPC cells detected during the detection operation.

Following the detection operation, media controller 124 can trigger a normal verify of PV_L1 and count or track the number of cells that passed in the normal verify operation.

The number of cells that should be SSPC in the ideal case can be counted as the difference between cells passing PV_L1 and cells passing (PV_L1–GS/2). In one example, media controller 124 triggers a second strobe with the SSPC detection trim program verify. To distinguish the SSPC program verify from the program for the level, the SSPC PV can be referred as a pre-program verify (PPV), referring to performing a program verify on the SSPC cells prior to the program verify for the level. It will be understood that the SSPC operation can be referred to by a different designation.

In one example, the pulse or the strobe for the SSPC PV or PPV represents a best estimate of the SSPC level, which can be temperature calibrated or adjusted for temperate changes. If the PPV is set to an ideal value, it would detect the number of cells identified in the detection. If the initial PPV value is not ideal, it will result in a bit count that is higher or lower than the ideal setting, and in one example, media controller 124 can perform a computation or a linear search or a binary search to calibrate the PPV. The searching can include repeats of the strobe and count. In one example, after determining the difference between the ideal SSPC count and the count obtained with the initial PPV settings, media controller 124 can perform a tabulated adjustment or other computation to set a new PPV value.

In one example, if system 100 includes computational resources for a computationally complex operations, media controller 124 can calculate the ideal PPV based on the initial setting and the detected number of SSPC cells. In one example, the ideal PPV can be expressed analytically as a function of sensing trims and subthreshold slope, where subthreshold slop (SS) is dependent on temperature and WL position, and changes with cycling. In one example, media controller 124 can calculate the SS from the counts coming from dual strobes of PV and PPV. In one example, the calculation can be performed dynamically on the first pulse or calculated and stored with the initial voltage (e.g., dynamic start voltage (DSV)).

In one example, NVM die 130 includes boost circuits boost 142 for sense circuits 144. The boost circuit can be or can include a boost capacitor. Boost 142 provides charge to sense circuit 144 to bias the sense circuit. Voltage regulator 140 represents circuitry to provide a bias voltage or charging voltage to boost 142. In one example, voltage regulator 140 charges boost 142, and boost 142 can apply a boost voltage on sense circuit 144, where the boost voltage is specific to an SSPC cell level, as determined by SSPC detector 126.

Thus, system 100 can perform a verify pulse to perform a detection of the SSPC properties, for the first program cycle. After determining the number of SSPC cells, the media controller can determine the ideal PPV to trigger the Vt of the expected number of SSPC cells. The detection and calculation can be thought of as dynamic detection, which accounts for the different system conditions. Thus, system 100 can dynamically adjust the program verify based on the conditions of the system.

The detection of the number of SSPC cells and calculation of the PPV may incur a performance penalty, which would be small because it is performed only once at the beginning of a program sequence, reusing the SSPC calculation for subsequent program operations on that WL or a group of WLs. It is also possible, depending on system design, that the performance penalty for the extra sensing (e.g., detection and PPV calculation) can improve the rest of the programming and decrease errors to the point that there is an overall performance improvement in the system. Whether or not there is a penalty, the reliability of SSD 120 is expected to improve.

Figure 2:
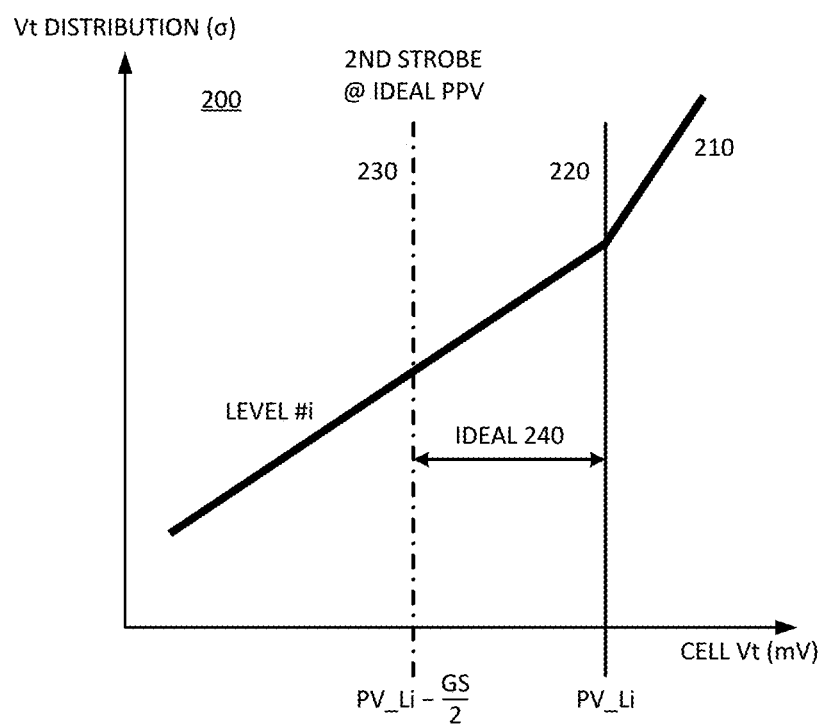
FIG. 2 is a diagrammatic representation of Vt distribution that illustrates SSPC detection.

FIG. 2 is a diagrammatic representation of Vt distribution that illustrates SSPC detection. Diagram 200 illustrates cell Vt in millivolts (mV) versus Vt distribution ($\sigma$). Diagram 200 can represent the Vt distribution for NVM cells of a system in accordance with an example of system 100.

Curve 210 represents the Vt distribution curve for cell Vt for level #i. Curve 210 can represent a portion of a graph that maps the distribution for all levels of programming for a multilevel cell. Ideal 240 represents cells that are within GS/2 below the desired Vt (line 220) of the level that of the programming, Cells between line 230 and line 220 should be marked as SSPC. Slowing down the cells within ideal 240 can help narrow the state width for a given GS or a given program level.

The second strobe at the ideal PPV is illustrated by line 230, which is at (PV_Li–GS/2), where i is an integer, representing which level of programming is being performed. In one example, the ideal program voltage set by adjustment to the boost voltage is approximately one-half a program step voltage lower than a WL program voltage. GS refers to a gate step, which is a program step voltage. PV_Li is represented by line 220, which is the program step voltage for level Li. Setting the PPV voltage to the value at line 230 will capture SSPC cells that have a Vt within the voltage range (PV_Li–GS/2) to (PV_Li).

Figure 3:
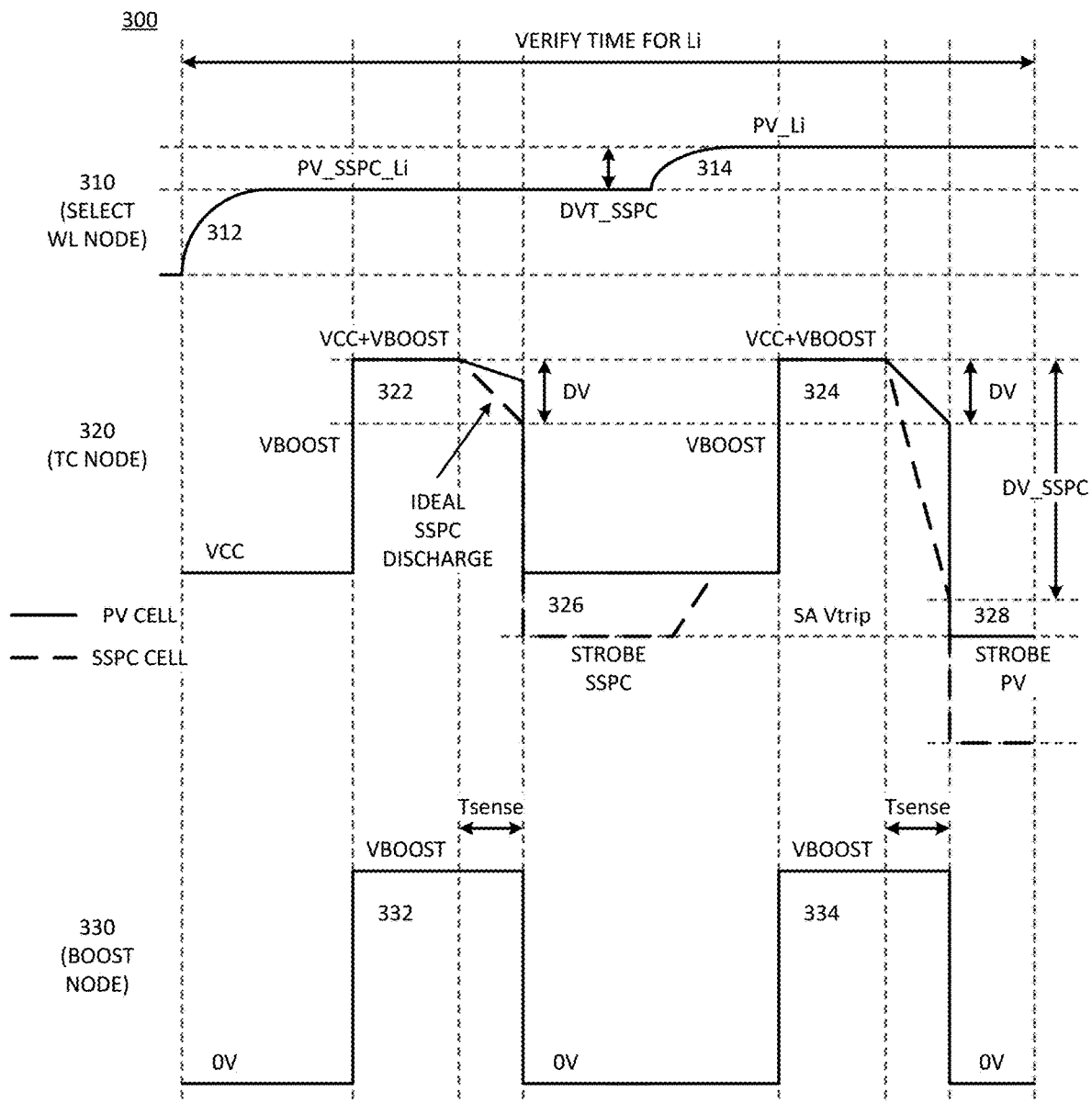
FIG. 3 is a representation of an example of SSPC detection with extended program verify.

FIG. 3 is a representation of an example of SSPC detection with extended program verify. Diagram 300 represents voltage response curves for program verify for standard cells and SSPC cells in accordance with an example of system 100. Curve 310 represents the voltage response over time for a selected WL node. Curve 320 represents the voltage response over time for a sense node. Curve 330 represents the voltage response over time for a boost node.

The line at the top of diagram 300 illustrates the verify time for level Li. Curve 310 represents a curve for a select WL node. At 312 the WL node is raised to PV_SSPC_Li. The first pulse on the sense node and the boost node occur when the WL node is at PV_SSPC_Li, for SSPC detection. In one example, the curve is raised to PV_Li at 314. The second pulse on the sense node and the boost node occur when the WL nod is at PV_Li, for normal cell or non-SSPC cell verify, with a boost set for an SSPC verify.

Curve 320 represents the voltage response for a sense node. The sense node is labeled as the "TC node," which can refer to a sense circuit architecture in which the sense node is a terminal of a temporary capacitor (TC). Curve 330 represents the voltage response for a boost node or a boost circuit, which will boost the sense node. In one example, the boost node starts at 0 V. Curve 332 represents a boost voltage of Vboost.

In one example, the sense node is initially charged to Vcc for curve 320. In response to Vboost on the boost node, the sense node is increased by Vboost to Vcc+Vboost, as seen with curve 322. In one example, the Vboost voltage when the WL is at PV_SSPC_Li is not enough voltage to cause the non SSPC cells to generate a sufficient current to discharge enough to reach the sense amplifier trip voltage, SA Vtrip.

After tsense, the system applies a reverse boost to take boost back to 0 V, as seen with curve 332. During tsense, the sense node discharges. A standard cell or PV cell will not discharge with much current, as seen by the solid line of curve 322. The SSPC cell will discharge with a current to provide the ideal SSPC discharge illustrated by the dashed line of curve 322. The dashed line discharges DV during tsense. In response to the reverse boost, the PV cell is still above the sense amplifier trip voltage.

As seen by the dashed line for the strobe SSPC at 326, the SSPC cell is able to be detected by the sense amplifier. The first pulse at curve 322 detects the SSPC cells, but does not trip the PV cells. Thus, the media controller can count the number of SSPC cells that tripped to determine the number of SSPC cells that should be detected with the SSPC boost.

While curve 322 shows a read for SSPC, curve 324 illustrates how much the system will need to push the SSPC cells when providing a read for the non-SSPC cells. Curve 334 on the boost node again raises the boost node to Vboost, which is applied to the sense node at 324. The voltage on the WL is higher by DVT_SSPC, referring to a differential voltage threshold for SSPC cells.

At the higher WL voltage, the sense node boost causes the PV cells to trip and discharge during tsense with the ideal current for discharge. The PV cell will discharge DV. As seen by the dashed line, the SSPC cell with discharge DV_SSPC. In response to the reverse boost to drop the boost node back to 0 V, as seen at 328, the solid line shows the strobe PV will trip the SA Vtrip.

It will be understood that diagram 300 as shown represents an ideal case, where the first verify pulse is used to determine the ideal SSPC verify. Essentially, diagram 300 illustrates double the number of verifies for every verify operation. For each level at any loop, an additional verify for PV_SSPC would be performed before the conventional verify operation. The performance penalty of doubling the number of verifies is impractical for a system implementation.

Figure 4:
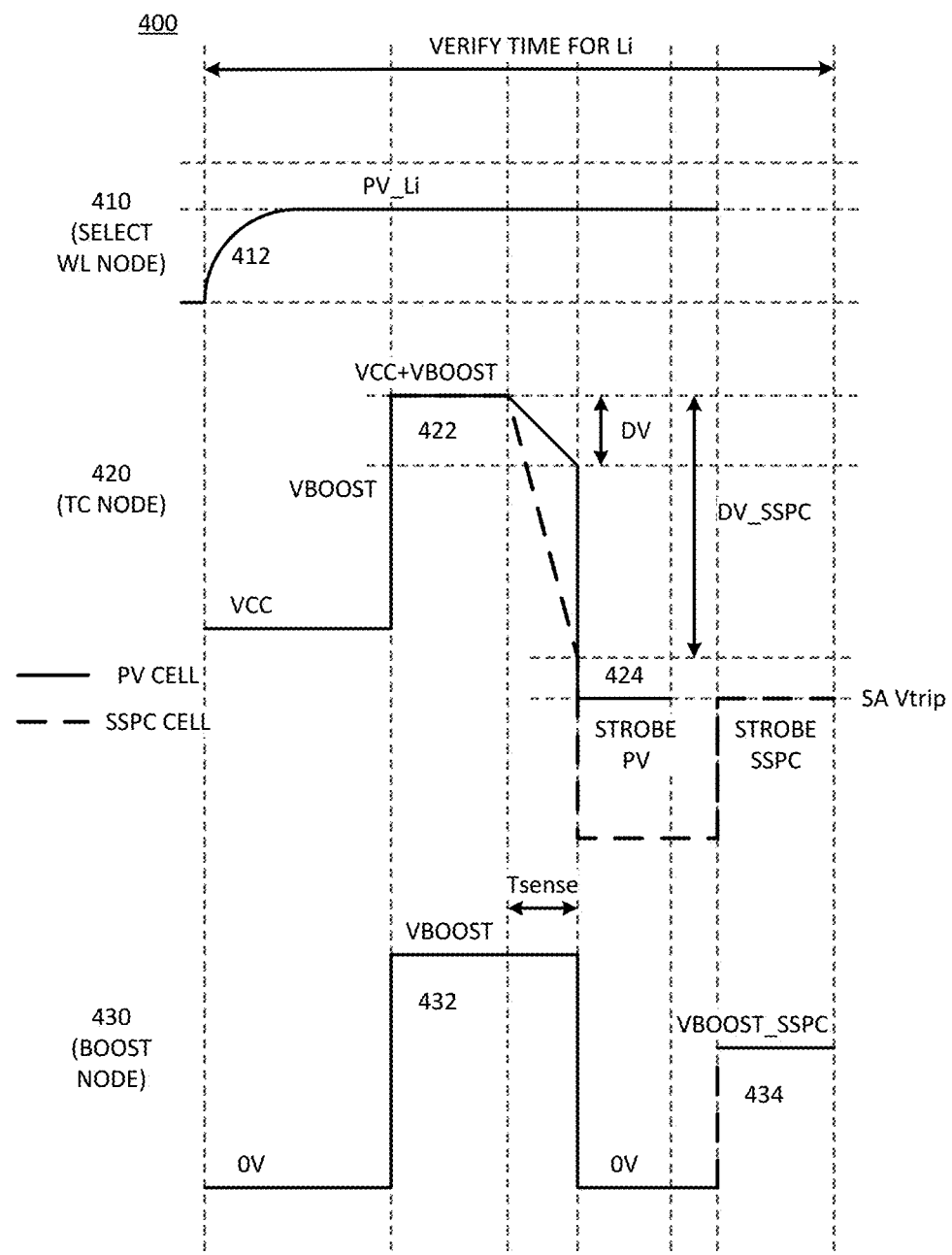
FIG. 4 is a representation of an example of SSPC detection with detection of non-SSPC cells.

FIG. 4 is a representation of an example of SSPC detection with detection of non-SSPC cells. Diagram 400 represents voltage response curves for program verify for standard cells and SSPC cells in accordance with an example of system 100. Curve 410 represents the voltage response over time for a selected WL node. Curve 420 represents the voltage response over time for a sense node. Curve 430 represents the voltage response over time for a boost node.

The line at the top of diagram 400 illustrates the verify time for level Li. Curve 410 represents a curve for a select WL node. At 412 the WL node is raised to PV_Li. Curve 420 represents the voltage response for a sense node. The sense node is labeled as the TC node for the output temporary capacitor. Curve 430 represents the voltage response for a boost node or a boost circuit, which will boost the sense node. In one example, the boost node starts at 0 V. Curve 432 represents a boost voltage of Vboost.

In one example, the sense node is initially charged to Vcc for curve 420. In response to Vboost on the boost node, the sense node is increased by Vboost to Vcc+Vboost, as seen with curve 422. In one example, the Vboost voltage when the WL is at PV_Li causes the PV cell to discharge DV during tsense. The discharge is ideal for the PV cell as illustrated by the solid line. As seen by the dashed line at 424, the SSPC cell with discharge DV_SSPC.

After tsense, the boost node can apply a negative boost to bring the node back down to 0 V, as seen at 424, the solid line shows the strobe PV will trip the SA Vtrip. In one example, the boost node is brought back up to Vboost_SSPC at 434 of curve 430. In response to Vboost_SSPC, the sense node will bring up the SSPC cells to push them up at least to the level of detection, as seen by strobe PV and strobe SSPC. Without detection, the amount of boost for Vboost_SSPC is not guaranteed to be ideal.

If diagram 400 represents a conventional SSPC boost scenario, the system will have a fixed amount for Vboost_SSPC at 434. The fixed SSPC boost will be set based on an average of conditions and factors. If diagram 400 represents a verify operation after detection of the number of SSPC cells, Vboost_SSPC will be calculated specific to the number of SSPC cells that are in the system at a given condition. Vboost_SSPC can then be set specific to the conditions to detect the specific number of SSPC cells.

As seen at 422, the SSPC cells have a lower Vt, resulting in a higher string current, providing a much larger DV_SSPC over the sense time tsense. Diagram 400 does not show devoting an independent verify to SSPC detection as performed in diagram 300. The application of an independent verify to perform SSPC detection enable the system to dynamically adapt to changes in the sub-threshold swing to know how much Vboost to bring the SSPC cells back up to the sense amplifier threshold.

Figure 5A:
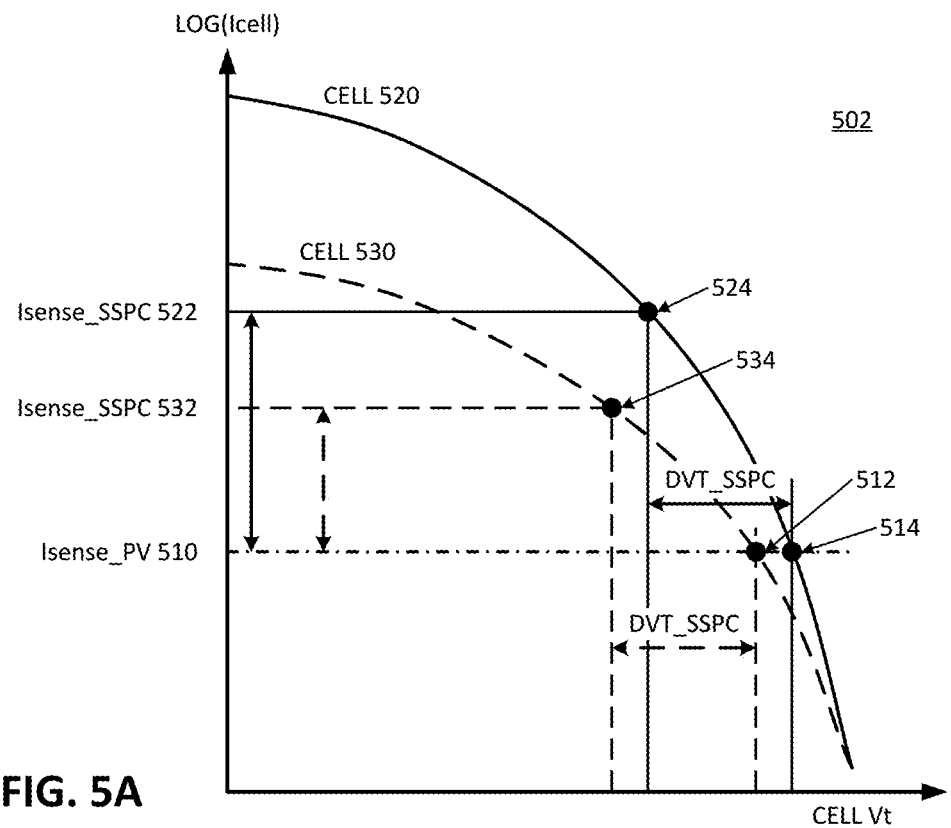
FIG. 5A is a diagrammatic representation of an example of cell transfer characteristics for SSPC cells.

FIG. 5A is a diagrammatic representation of an example of cell transfer characteristics for SSPC cells. By adjusting the boost node voltage of the sense amplifier, the system can detect cells as SSPC cells that have Vt higher than PV_SSPC rather than just PV. Diagram 502 represents differences between a fresh SSPC cell and an EOL SSPC cell in accordance with an example of cells in system 100.

In contrast to the conventional approach to setting PPV based on a median case or based on a worst case scenario, the media controller can dynamically detect the expected number of SSPC cells and set the PPV based on the detected number. The dynamic approach allows the system to adjust the PPV as the system conditions change.

Consider diagram 502, which illustrates cell transfer characteristics for SSPC cells. Diagram 502 illustrates a first curve for cell 520 and a second curve for cell 530. Cell 520 is the SSPC cell when it is new or it is a fresh cell. Cell 530 is the SSPC cell when it is near the end of life (EOL). A fresh cell has different characteristics than an EOL cell, due to the cycling and other conditions that change in the system over the lifecycle of the cell.

For each level of programming of a multilevel cell, there are certain cells that should be treated as SSPC cells to avoid putting too much charge in the cells. An ideal SSPC boost would capture the cells that should be SSPC cells, without capturing too many cells or capturing too few cells. The cells that should be treated as SSPC cells can be considered part of an "SSPC bucket."

A conventional approach to setting the PPV is to try to fix a PPV value that works for both cell 520 and cell 530. As see in diagram 502, the cell degrades with shallower subthreshold swing as the cycle count increases. Cycling in general results in oxide trap up and degradation, which results in a shallower (i.e., larger) SS of the memory cell characteristics.

The SSPC bucket can be defined by the Vt voltage that would capture the ideal number of SSPC cells. A shallower SS means that for the SSPC bucket defined by DVT_SSPC=GS/2, cells at the lower Vt side of the SSPC bucket exhibit significantly smaller cell current at the end of life compared to the beginning of life.

The ideal boundary of the SSPC bucket will have less current difference between PV and PPV cell at the end of life compared to fresh conditions (since the SS has degraded), which indicates that there will be a lower drop in Vboost_SSPC (PPV) voltage. In one example, the media controller provides an appropriate reduction in Vboost_SSPC (PPV) to achieve the best placement or window margin.

Isense_PV 510 represents the sense current for the PV cell. The Isense_PV line intersects the curve for cell 520 at point 514 and intersects the curve for cell 530 at point 512. Isense_SSPC 522 represents the sense current for SSPC cell 520. Isense_SSPC 522 intersects the curve for cell 520 at point 524. The voltage difference between point 514 and point 524 is DVT_SSPC. Starting with point 512 for the curve of cell 530, and then going back DVT_SSPC determines point 534 on the curve for cell 530.

In one example, Isense_SSPC 522 is 4× larger than Isense_PV 510, indicating a 4× difference when the memory array is fresh. In one example, Isense_SSPC 532 is only 3× larger than Isense_PV 510, indicating that the EOL cell should be treated differently than the fresh cell. In one example, the media controller can dynamically adjust the Vboost_SSPC to reflect the difference in the ideal SSPC sense current.

Figure 5B:
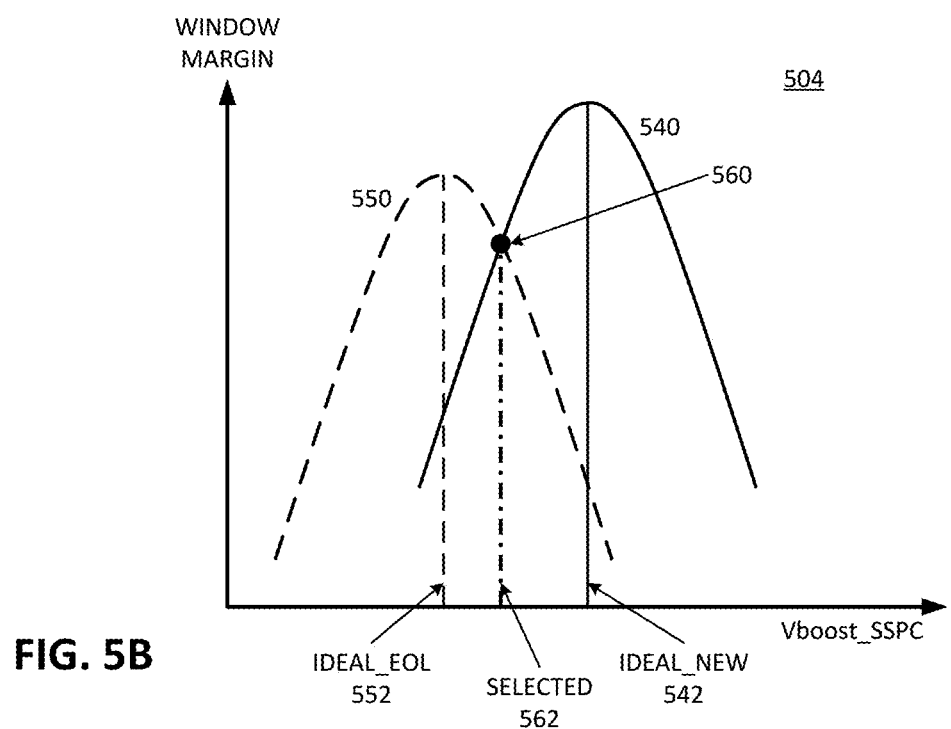
FIG. 5B is a diagrammatic representation of an example of selecting a Vboost.

FIG. 5B is a diagrammatic representation of an example of selecting a Vboost. Diagram 504 provides an example of Vboost_SSPC against window margin. Curve 540 represents a curve for an example of cell 520 of diagram 502. Curve 550 represents a curve for an example of cell 530 of diagram 502.

The peaks of curve 540 and curve 550 represent the ideal SSPC Vboost for the different cells. Line 542 represents the ideal Vboost_SSPC for a new cell. Line 552 represents the ideal Vboost_SSPC for an EOL cell.

Curve 540 intersects with curve 550 at point 560. A traditional fixed Vboost_SSPC would set line 562 as the selected Vboost_SSPC. In contrast to a fixed compromise point between the two curves, the media controller can adjust the SSPC boost to ideal_new 542 for new cells, and adjust the SSPC boost to ideal_EOL 552 for a cell near end of life.

Figure 6:
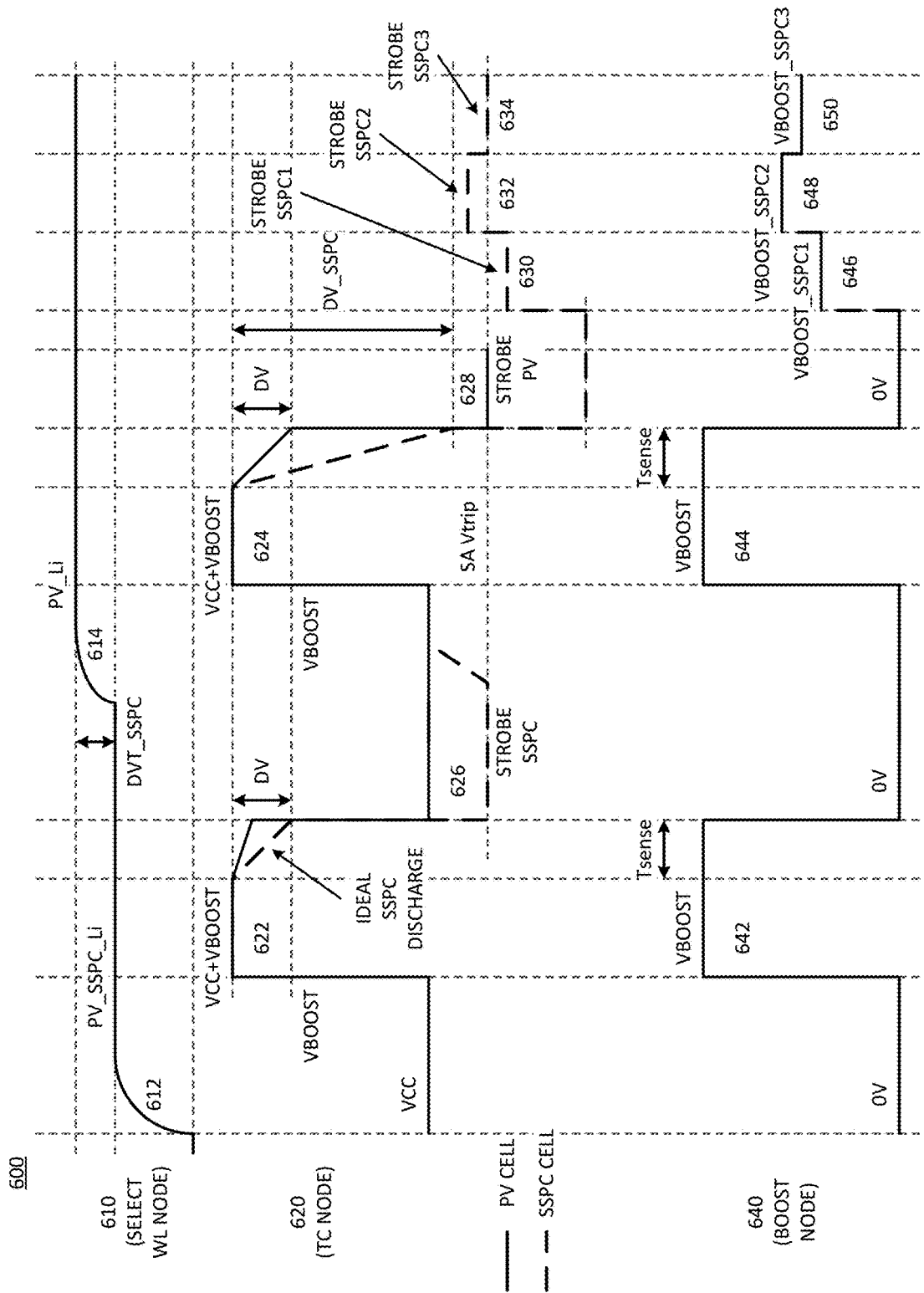
FIG. 6 is a representation of an example of SSPC detection with different first pass and subsequent pass operations.

FIG. 6 is a representation of an example of SSPC detection with different first pass and subsequent pass operations. Diagram 600 represents voltage response curves for program verify for standard cells and SSPC cells in accordance with an example of system 100. Diagram 600 illustrates SSPC detection in accordance with an example of diagram 300. Diagram 600 illustrates SSPC boost in accordance with an example of diagram 400.

Diagram 600 allows a media controller to produce a PPV that adapts to conditions in a computing system. Thus, the PPV in diagram 600 can depend on subthreshold swing detection and adjustment, allowing the system to adjust PPV based on where a block or page is located in the memory device, how many cycles it has undergone, temperature, and other conditions. Diagram 600 illustrates detection performed at the beginning of programming any page, without needing additional pulses for each program operation.

The line at the top of diagram 300 illustrates the verify time for level Li. Curve 310 represents a voltage response curve over time for a select WL node. At 612 the WL node is raised to PV_SSPC_Li. The first pulse on the sense node and the boost node occur when the WL node is at PV_SSPC_Li, for SSPC detection. In one example, the curve is raised to PV_Li at 614. PV_Li is illustrated as being DVT_SSPC higher than PV_SSPC_Li. The second pulse on the sense node and the boost node occur when the WL nod is at PV_Li, for normal cell or non-SSPC cell verify, as well as a sequence or series of boosts for an SSPC cell verify.

Curve 620 represents the voltage response over time for a sense node. The sense node is labeled as the "TC node," which can refer to a sense circuit architecture in which the sense node is a terminal of a temporary capacitor (TC). Curve 630 represents the voltage response over time for a boost node or a boost circuit, which will boost the sense node. In one example, the boost node starts at 0 V. Curve 642 represents a boost voltage of Vboost.

In one example, the sense node is initially charged to Vcc for curve 620. In response to Vboost on the boost node, the sense node is increased by Vboost to Vcc+Vboost, as seen with curve 622. In one example, the Vboost voltage when the WL is at PV_SSPC_Li is not enough voltage to cause the non SSPC cells to generate a sufficient current to discharge enough to reach the sense amplifier trip voltage, SA Vtrip.

After tsense, the system applies a negative boost to take the boost node back to 0 V, as seen with curve 642. During tsense, the sense node discharges. A standard cell or PV cell will not discharge with much current, as seen by the solid line of curve 622. The SSPC cell will discharge with a current to provide the ideal SSPC discharge illustrated by the dashed line of curve 622. The dashed line show an SSPC discharge of DV during tsense. In response to the reverse boost, the PV cell is still above the sense amplifier trip voltage, while the SSPC node is readable by the sense amplifier, as seen at 626 with strobe SSPC being at SA Vtrip. Thus, the boost pulse will read the SSPC cells and not the cells that are not SSPC, enabling the media controller to detect and count the ideal number of SSPC cells. The media controller can use the ideal number as the expected number of SSPC cells for subsequent operations.

While curve 622 shows SSPC detection, curve 624 illustrates how the system will apply a SSPC boost to trigger the expected number of SSPC cells. Curve 644 on the boost node again raises the boost node to Vboost, which is applied to the sense node at 624. The voltage on the WL is higher by DVT_SSPC, referring to a differential voltage threshold for SSPC cells.

At the higher WL voltage, the sense node boost causes the PV cells to trip and discharge during tsense with the ideal current for discharge. The PV cell will discharge DV. As seen by the dashed line, the SSPC cell with discharge DV_SSPC. In response to the reverse boost to drive the boost node back to 0 V, as seen at 628, the solid line shows the strobe PV will trip the SA Vtrip.

In one example, the media controller triggers a boost voltage on the boost node to bring the SSPC cells back up to the SA Vtrip level. Diagram 600 illustrates a binary search, but it will be understood that other types of search could be used, or the system can perform complex calculations to determine the ideal Vboost to apply.

In one example, the boost node is raised by Vboost_SSPC1 at 646, followed by Vboost_SSPC2 at 648, followed by Vboost_SSPC3 at 650. It will be understood that a different number of SSPC boost voltage could be used to push the SSPC cells in/out of the SSPC bucket defined by Vboost and Vboost_SSPC<n>, where n=1, 2, 3 . . . . The media controller can read the number of SSPC cells upon strobing after each Vboost_SSPC<n> to determine which SSPC boost provides the ideal bucket that would capture cells between PV_Li and PV_Li–GS/2.

In one example, in response to Vboost_SSPC1, curve 620 is raised to strobe SSPC1 at 630, which is still below SA Vtrip. In response to Vboost_SSPC2, curve 620 is raised to strobe SSPC2 at 632, which overshoots SA Vtrip. In response to Vboost_SSPC3, curve 620 is raised to strobe SSPC3 at 634, which represents the ideal Vboost_SSPC to achieve SA Vtrip.

In accordance with an example of diagram 600, a media controller can detect the number of SSPC cells that should be in the ideal bucket, with the first Vboost and discharge set for the SSPC cell. The media controller can obtain a count of the cells expected to pass PPV in the ideal case with the first boost.

In one example, the media controller can perform normal verify with a second strobe. In one example, the second strobe utilizes an initial guess or initial estimate of PPV.

Given that the ideal count of SSPC is known from the detection, the media controller can cause an appropriate increase or decrease to PPV to trigger the ideal count of SSPC cells. Diagram 600 represents an example of a binary search to calibrate PPV. Vboost_SSPC1 represents an initial estimate of the proper boost. With a binary search, Vboost_SSPC2 represents a delta (Δ) increase in Vboost, representative of the fact that the Vboost_SSPC1 was too small, resulting in a count of SSPC that is lower than the expected count or the ideal count. Vboost_SSPC3 represents a decrease of a divided repeat strobe, e.g., Δ/2, representative of the fact that Vboost_SSPC2 results in too high a boost. The search in diagram 600 is understood to be simplified for purposes of example; more complex searches could be needed in actual systems.

It will be understood that after the proper Vboost_SSPC is found at 634, the media controller can reuse the same boost for subsequent programs of the same page or same block or other portion having the same characteristics. Thus, subsequent program operation could continue as illustrated in diagram 400. A system applying the SSPC dynamic detection and dynamic setting of the Vboost for the expected SSPC count can thus adapt to dynamic conditions in the media device. In one example, the system can adapt to a temperature change, or to a different wordline position, or to a change in cycling count, or to a different change, or to a combination of change conditions.

Figure 7A:
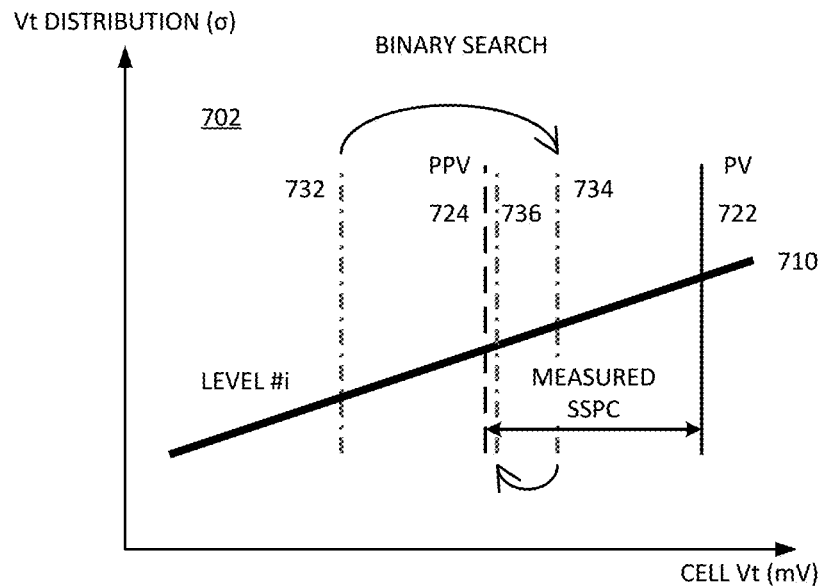
FIG. 7A is a diagrammatic representation of an example of a binary search to detect SSPC subthreshold.

FIG. 7A is a diagrammatic representation of an example of a binary search to detect SSPC subthreshold. Diagram 702 illustrates cell Vt in millivolts (mV) versus Vt distribution (σ). Diagram 702 can represent the Vt distribution for a search for ideal PPV for a system in accordance with an example of system 100, or can set the ideal PPV for a distribution in accordance with an example of diagram 200.

Curve 710 represents the Vt distribution curve for cell Vt for level #i. Curve 710 can represent a portion of a graph that maps the distribution for all levels of programming for a multilevel cell. PV 722 represents a PV voltage for level #i. PPV 724 can represent an ideal PPV for SSPC cells for PV 722. Measured SSPC between PV 722 and PPV 724 represents the difference between the PV 722 and the ideal placement of the SSPC PV in accordance with the number of SSPC cells detected during a detection operation.

Consider that based on a PV voltage level used for SSPC detection, the media controller determines that line 732 should be the starting point for a binary search sequence to determine the ideal PPV. The media controller can iteratively perform program verify for the SSPC cells with the binary search operation to detect the ideal SSPC level.

Thus, the media controller can perform program verify with the PV set to the value of line 732. The media controller can determine if the SSPC cell count detected is higher or lower than what is expected from the detection operation. Then, the media controller can perform program verify with the PV set to the value of line 734, assuming that line 732 resulted in an SSPC count that was too high. If line 734 results in an SSPC count that is too low, the media controller can make a next program verify pass at the level of line 736. Line 736 is either the same as PPV 724, or within an acceptable range or tolerance of PPV 724. The media controller can then set line 736 as the value for subsequent SSPC PV operations having the same conditions as the line to which curve 710 applies.

Figure 7B:
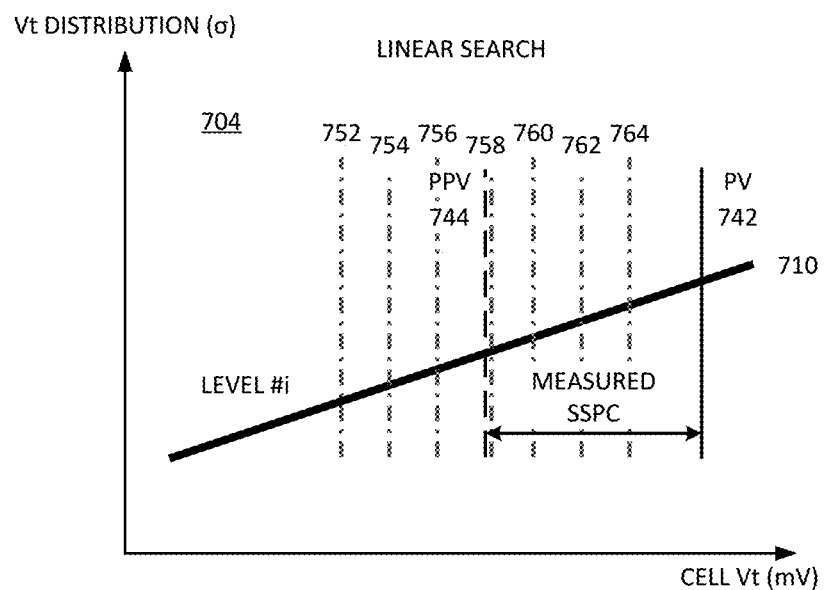
FIG. 7B is a diagrammatic representation of an example of a linear search to detect SSPC subthreshold.

FIG. 7B is a diagrammatic representation of an example of a linear search to detect SSPC subthreshold. Diagram 704 illustrates cell Vt in millivolts (mV) versus Vt distribution (σ). Diagram 704 can represent the Vt distribution for a search for ideal PPV for a system in accordance with an example of system 100, or can set the ideal PPV for a distribution in accordance with an example of diagram 200.

Curve 710 represents the Vt distribution curve for cell Vt for level #i. Curve 710 can represent a portion of a graph that maps the distribution for all levels of programming for a multilevel cell. PV 742 represents a PV voltage for level #i. PPV 744 can represent an ideal PPV for SSPC cells for PV 742. Measured SSPC between PV 742 and PPV 744 represents the difference between the PV 742 and the ideal placement of the SSPC PV in accordance with the number of SSPC cells detected during a detection operation.

Consider that based on a PV voltage level used for SSPC detection, the media controller determines that line 752 should be the starting point for a linear search sequence to determine the ideal PPV. The media controller can iteratively perform program verify for the SSPC cells with the linear search operation to detect the ideal SSPC level.

Thus, the media controller can perform program verify with the PV set to the value of line 752. The media controller can determine if the SSPC cell count detected is higher or lower than what is expected from the detection operation. Then, the media controller can perform program verify with the PV set to the value of line 754, assuming that line 752 resulted in an SSPC count that was too high.

In one example, the media controller will make a predetermined number of passes (seven passes are illustrated in diagram 704) with a predetermined step or differential between linear search steps. Thus, the media controller can perform passes with PV values at line 754, line 756, line 758, line 760, line 762, and line 764. The controller can count the number of SSPC cells determined for each pass and select the level of the line that was closest to PPV 774. Line 758 is illustrated as being the closest to PPV 744. Thus, the media controller will select line 758 as the SSPC PV value for subsequent SSPC PV operations having the same conditions as the line to which curve 710 applies.

Figure 8:
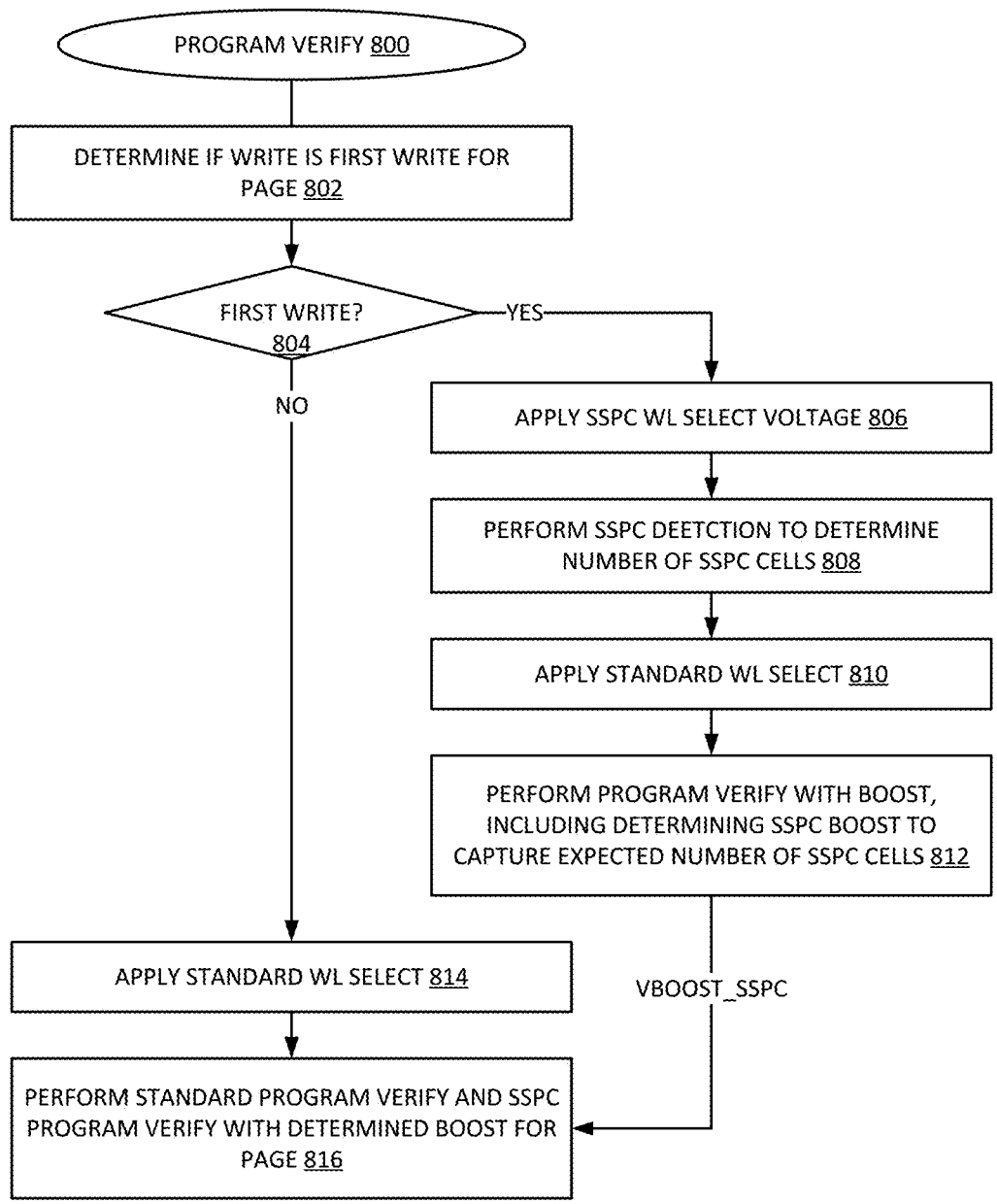
FIG. 8 is a flow diagram of an example of a process for program verify with SSPC detection.

FIG. 8 is a flow diagram of an example of a process for program verify with SSPC detection. Process 800 represents a process for program verify that can be performed by a system in accordance with an example of system 100. Process 800 can be executed by a media controller to perform detection and program verify in accordance with an example of diagram 600.

In one example, the media controller determines if the write is a first write for a page, 802. A page is referenced, but could be any segment of memory that will have the same conditions that affect subthreshold swing of the SSPC cells. If the write is not a first write, at 804 NO branch, in one example, the media controller applies a standard WL select voltage to the wordlines, at 814.

If the write is a first write, at 804 YES branch, in one example, the media controller applies an SSPC select voltage to the wordlines, at 806. The SSPC select voltage can be lower than the standard WL select voltage. In one example, the media controller performs SSPC detection to determine a number of SSPC cells for the program level, at 808.

In one example, after determining how many SSPC cells are present, the media controller can apply the standard wordline select voltage, at 810. In one example, the media controller performs program verify with a boost, including determining the SSPC boost to capture the expected number of SSPC cells, at 812. The determined Vboost_SSPC can then be provided for use for subsequent verifies. The media controller can perform standard program verify and SSPC program verify with the determined SSPC boost for the page for other program verify operations, at 816.

Figure 9A:
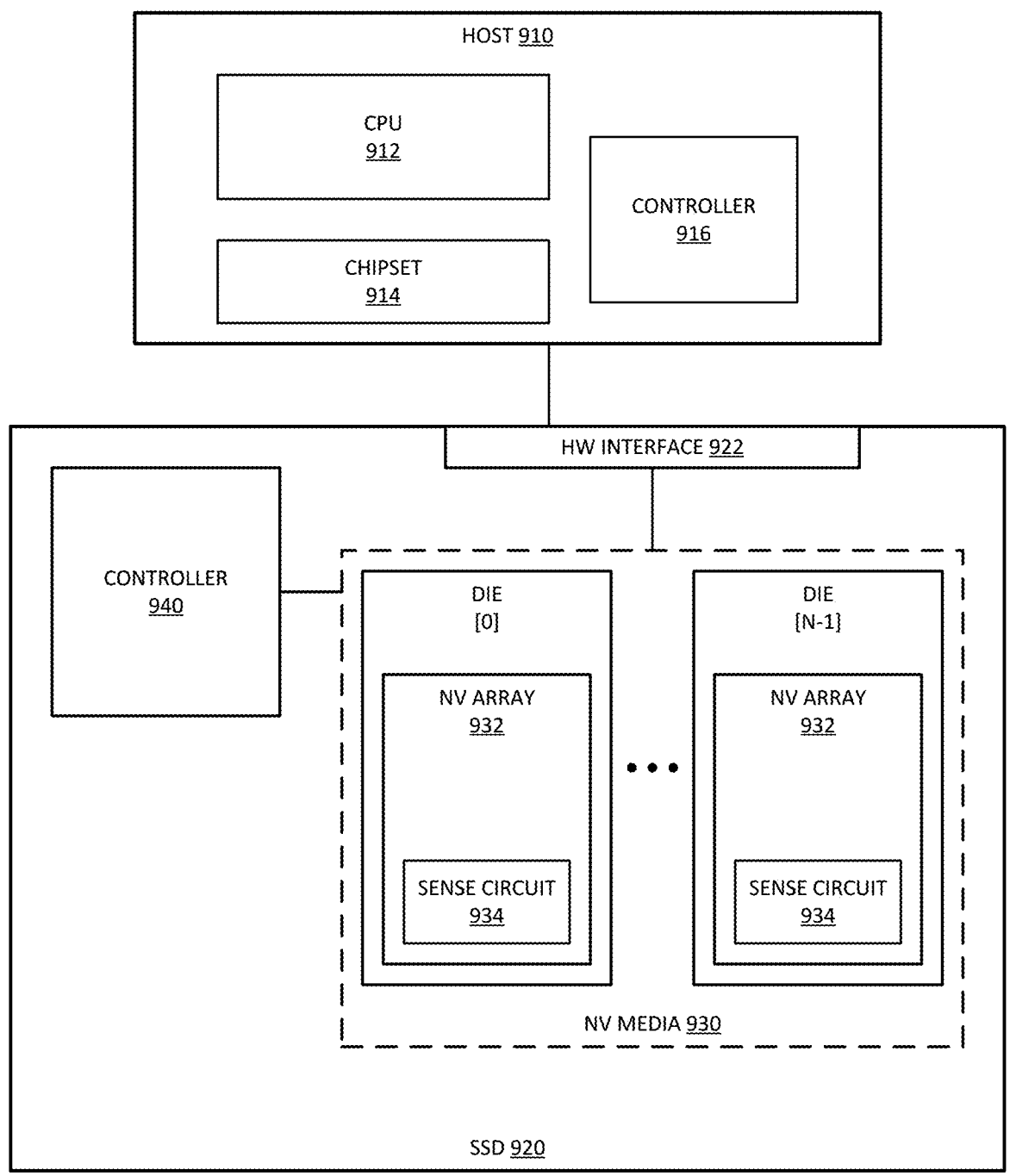
FIG. 9A is a block diagram of an example of a system with a hardware view of a solid state drive (SSD) with a nonvolatile array having sense circuitry that performs SSPC detection.

FIG. 9A is a block diagram of an example of a system with a hardware view of a solid state drive (SSD) with a nonvolatile array having sense circuitry that performs SSPC detection. System 902 represents components of a nonvolatile storage system that can implement a SSPC boost detection in accordance with an example of system 100, in accordance with any example herein.

System 902 includes SSD 920 coupled with host 910. Host 910 represents a host hardware platform that connects to SSD 920. Host 910 includes CPU (central processing unit) 912 or other processor as a host processor or host processor device. CPU 912 represents any host processor that generates requests to access data stored on SSD 920, either to read the data or to write data to the storage. Such a processor can include a single or multicore processor, a primary processor for a computing device, a graphics processor, a peripheral processor, or a supplemental or auxiliary processor, or a combination. CPU 912 can execute a host OS and other applications to cause the operation of system 902.

Host 910 includes chipset 914, which represents hardware components that can be included in connecting between CPU 912 and SSD 920. For example, chipset 914 can include interconnect circuits and logic to enable access to SSD 920. Thus, host platform 910 can include a hardware platform drive interconnect to couple SSD 920 to host 910. Host 910 includes hardware to interconnect to the SSD. Likewise, SSD 920 includes corresponding hardware to interconnect to host 910.

Host 910 includes controller 916, which represents a storage controller or memory controller on the host side to control access to SSD 920. In one example, controller 916 is included in chipset 914. In one example, controller 916 is included in CPU 912. Controller 916 can be referred to as an NV memory controller to enable host 910 to schedule and organize commands to SSD 920 to read and write data.

SSD 920 represents a solid-state drive or other storage system or module that includes nonvolatile (NV) media 930 to store data. SSD 920 includes HW (hardware) interface 922, which represents hardware components to interface with host 910. For example, HW interface 922 can interface with one or more buses to implement a high speed interface standard such as NVMe (nonvolatile memory express) or PCIe (peripheral component interconnect express).

In one example, SSD 920 includes NV (nonvolatile) media 930 as the primary storage for SSD 920. In one example, NV media 930 is or includes a block addressable memory technology, such as NAND or NOR. In one example, NV media 930 can include a nonvolatile, block addressable media, a nonvolatile, byte addressable media, or a nonvolatile media that can be byte addressable or block addressable. In one example, NV media 930 includes 3D NAND cells.

In one example, NV media 930 is implemented as multiple dies, illustrated as N dies, Die[0: {N−1}]. N can be any number of devices, and is often a binary number. SSD 920 includes controller 940 to control access to NV media 930. Controller 940 represents hardware and control logic within SSD 920 to execute control over the media. Controller 940 is internal to the nonvolatile storage device or module, and is separate from controller 916 of host 910. The NV dies of NV media 930 include NV array 932. In one example, NV array 932 is a 3D memory array.

In one example, NV array 932 includes sense circuit 934 for sensing the values stored in the memory cells of the NV array. In one example, controller 940 implements SSPC cell detection and SSPC boost to enable sense circuit 934 to properly read the expected number of SSPC cells, in accordance with what is described above. The detection of SSPC cells and the application of a dynamic SSPC boost voltage based on the number of SSPC cells detected enables system 902 to adapt to changing conditions within NV array 932.

Figure 9B:
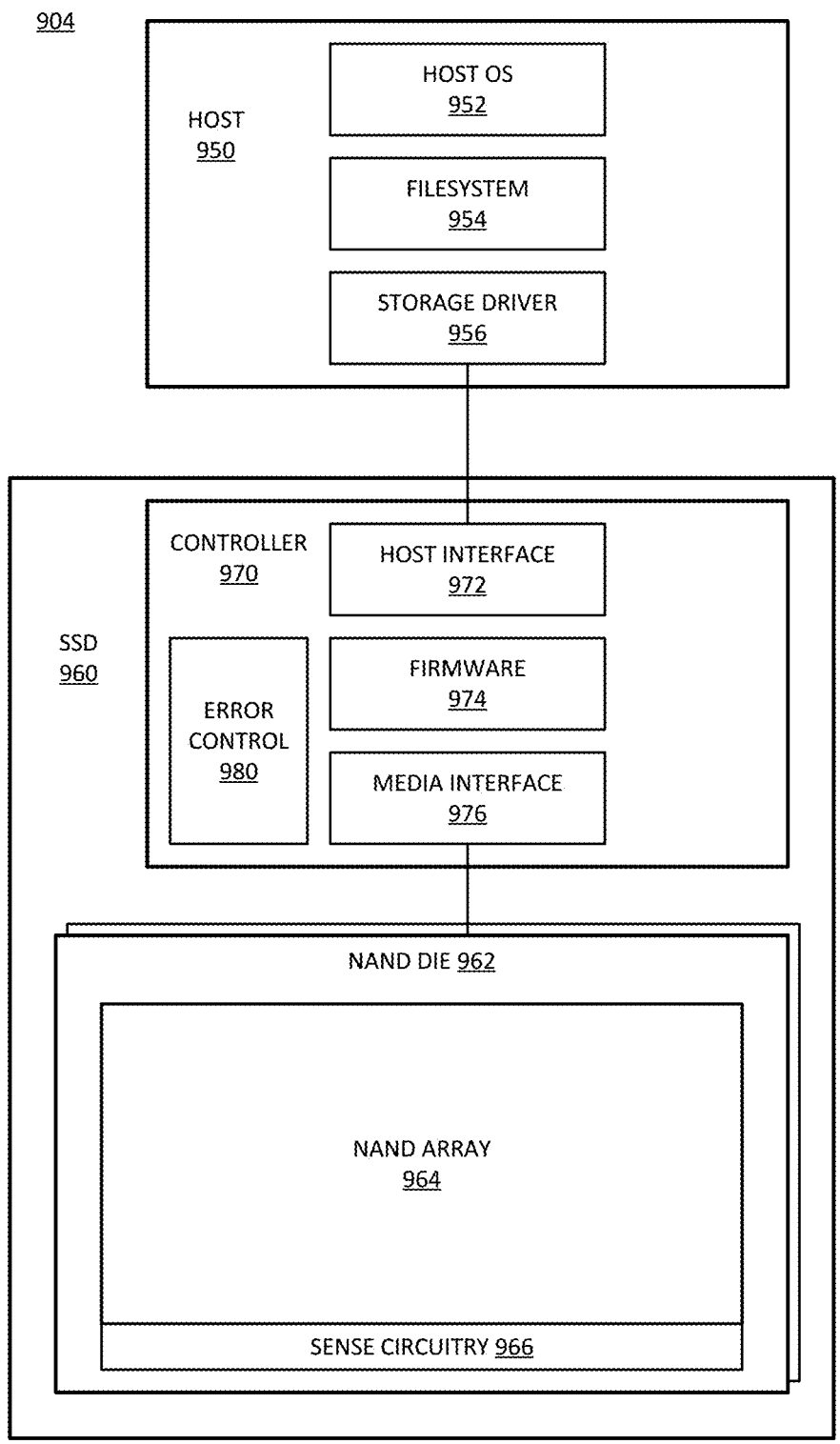
FIG. 9B is a block diagram of an example of a logical view of system with a solid state drive (SSD) with a nonvolatile array having sense circuitry that performs SSPC detection.

FIG. 9B is a block diagram of an example of a logical view of system with a solid state drive (SSD) with a nonvolatile array having sense circuitry that performs SSPC detection. System 904 illustrates a system with a nonvolatile memory array in accordance with an example of system 902 of FIG. 9A.

System 904 illustrates the logical layers of the host and SSD of a hardware platform in accordance with system 902. System 904 can represent software and firmware components of an example of system 902, as well as physical components. In one example, host 950 provides one example of host 910. In one example, SSD 960 provides one example of SSD 920.

In one example, host 950 includes host OS 952, which represents a host operating system or software platform for the host. Host OS 952 can include a platform on which applications, services, agents, and/or other software executes, and is executed by a processor. Filesystem 954 represents control logic for controlling access to the NV media. Filesystem 954 can manage what addresses or memory locations are used to store what data. There are numerous filesystems known, and filesystem 954 can implement known filesystems or other proprietary systems. In one example, filesystem 954 is part of host OS 952.

Storage driver 956 represents one or more system-level modules that control the hardware of host 950. In one example, drivers 956 include a software application to control the interface to SSD 960, and thus control the hardware of SSD 960. Storage driver 956 can provide a communication interface between the host and the SSD.

Controller 970 of SSD 960 includes firmware 974, which represents control software/firmware for the controller. In one example, controller 970 includes host interface 972, which represents an interface to host 950. In one example, controller 970 includes media interface 976, which represents an interface to NAND die 962. NAND die 962 represents a specific example of NV media, and includes an associated 3D NAND array 964. NAND array 964 includes an array of memory cells.

Media interface 976 represent control that is executed on hardware of controller 970. It will be understood that controller 970 includes hardware to interface with host 950, which can be considered to be controlled by host interface software/firmware 974. Likewise, it will be understood that controller 970 includes hardware to interface with NAND die 962. In one example, code for host interface 972 can be part of firmware 974. In one example, code for media interface 976 can be part of firmware 974.

In one example, controller 970 includes error control 980 to handle data errors in accessed data, and corner cases in terms of compliance with signaling and communication interfacing. Error control 980 can include implementations in hardware or firmware, or a combination of hardware and software.

In one example, NAND die 962 includes sense circuitry 966 for sensing the values stored in the memory cells of the NAND array. In one example, controller 970 implements SSPC cell detection and SSPC boost to enable sense circuitry 966 to properly read the expected number of SSPC cells, in accordance with what is described above. The detection of SSPC cells and the application of a dynamic SSPC boost voltage based on the number of SSPC cells detected enables system 904 to adapt to changing conditions within NAND array 964.

Figure 10:
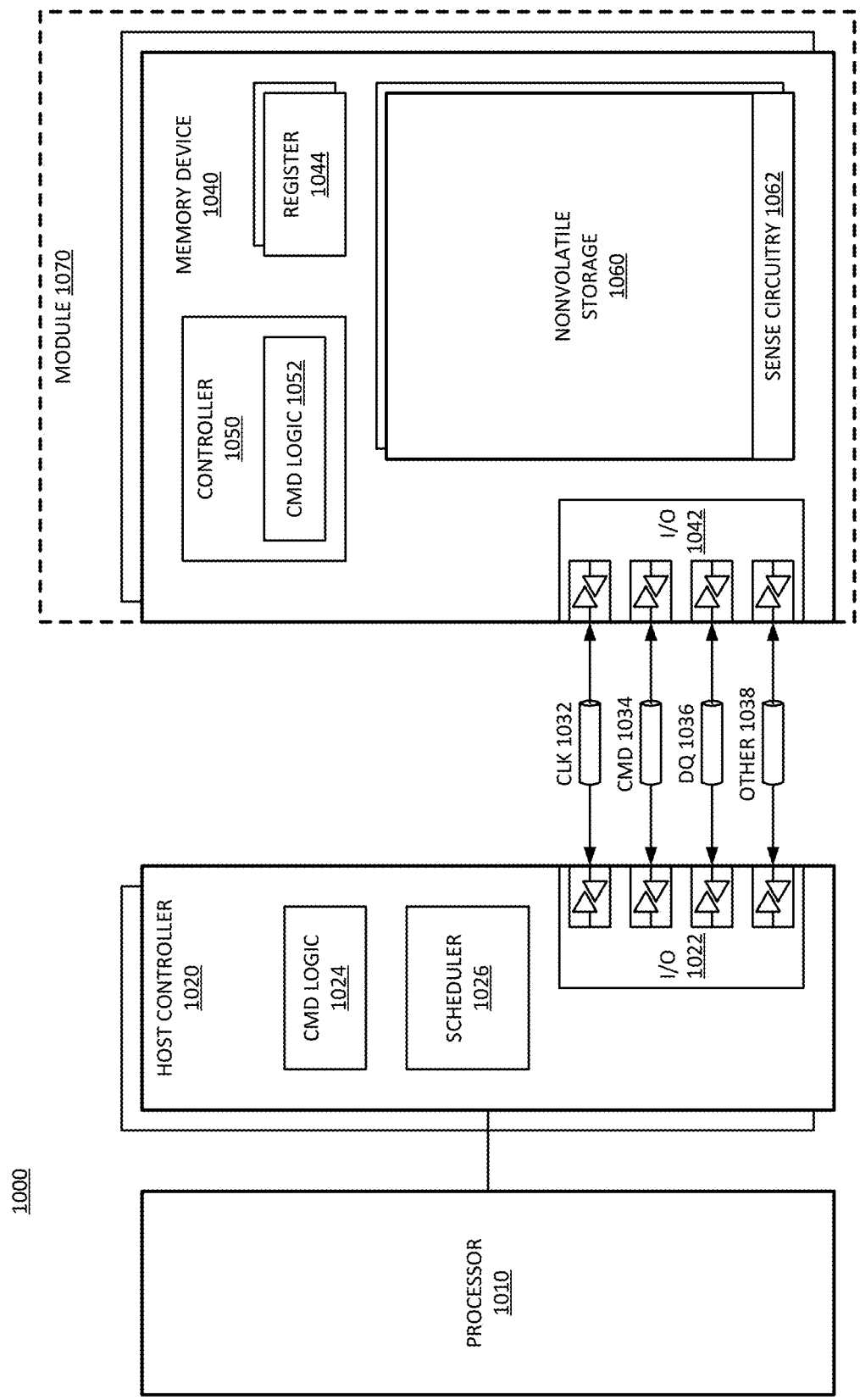
FIG. 10 is a block diagram of an example of a memory subsystem in which a nonvolatile array having sense circuitry that performs SSPC detection can be implemented.

FIG. 10 is a block diagram of an example of a memory subsystem in which a nonvolatile array having sense circuitry that performs SSPC detection can be implemented. System 1000 includes a processor and elements of a memory subsystem in a computing device.

In one example, nonvolatile storage 1060 includes sense circuitry 1062 for sensing the values stored in the memory cells of the nonvolatile storage array. In one example, controller 1050 implements SSPC cell detection and SSPC boost to enable sense circuitry 1062 to properly read the expected number of SSPC cells, in accordance with what is described above. The detection of SSPC cells and the application of a dynamic SSPC boost voltage based on the number of SSPC cells detected enables system 1000 to adapt to changing conditions within nonvolatile storage 1060.

Processor 1010 represents a processing unit of a computing platform that may execute an operating system (OS) and applications, which can collectively be referred to as the host or the user of the memory. The OS and applications execute operations that result in memory accesses. Processor 1010 can include one or more separate processors. Each separate processor can include a single processing unit, a multicore processing unit or multicore processor, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 1000 can be implemented as an SOC (system on a chip), or be implemented with standalone components.

Reference to memory devices can apply to different memory types, including nonvolatile memory devices whose state is determinate even if power is interrupted to the device. In one example, the nonvolatile memory device is a block addressable memory device, such as NAND or NOR technologies.

Memory controller 1020 represents one or more memory controller circuits or devices for system 1000. Memory controller 1020 represents control logic that generates memory access commands in response to the execution of operations by processor 1010. Memory controller 1020 accesses one or more memory devices 1040. Memory devices 1040 are coupled to memory controller 1020. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

Memory controller 1020 includes I/O interface logic 1022 to couple to a memory bus, such as a memory channel as referred to above. I/O interface logic 1022 (as well as I/O interface logic 1042 of memory device 1040) can include pins, pads, connectors, signal lines, traces, or wires, or other hardware to connect the devices, or a combination of these. I/O interface logic 1022 can include a hardware interface. As illustrated, I/O interface logic 1022 includes at least drivers/transceivers for signal lines. Commonly, wires within an integrated circuit interface couple with a pad, pin, or connector to interface signal lines or traces or other wires between devices. I/O interface logic 1022 can include drivers, receivers, transceivers, or termination, or other circuitry or combinations of circuitry to exchange signals on the signal lines between the devices. The exchange of signals includes at least one of transmit or receive. While shown as coupling I/O 1022 from memory controller 1020 to I/O 1042 of memory device 1040, it will be understood that in an implementation of system 1000 where groups of memory devices 1040 are accessed in parallel, multiple memory devices can include I/O interfaces to the same interface of memory controller 1020. In an implementation of system 1000 including one or more memory modules 1070, I/O 1042 can include interface hardware of the memory module in addition to interface hardware on the memory device itself. Other memory controllers 1020 will include separate interfaces to other memory devices 1040.

The bus between memory controller 1020 and memory devices 1040 can be implemented as multiple signal lines coupling memory controller 1020 to memory devices 1040. The bus may typically include at least clock (CLK) 1032, command/address (CMD) 1034, and write data (DQ) and read data (DQ) 1036, and zero or more other signal lines 1038. In one example, a bus or connection between memory controller 1020 and memory can be referred to as a memory bus. The signal lines for CMD enables memory controller 1020 to provide commands to memory device 1040. DQ 1036 enable the exchange of data between the devices, and can be referred to as a "data bus." In one example, independent channels have different clock signals, C/A buses, data buses, and other signal lines. Thus, system 1000 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 1020 and memory devices 1040. Other signals 1038, such as strobe lines DQS, can accompany a bus or sub bus.

In one example, memory devices 1040 are disposed directly on a motherboard or host system platform (e.g., a PCB (printed circuit board) on which processor 1010 is disposed) of a computing device. In one example, memory devices 1040 can be organized into memory modules 1070. In one example, memory modules 1070 represent dual inline memory modules (DIMMs). In one example, memory modules 1070 represent other organization of multiple memory devices to share at least a portion of access or control circuitry, which can be a separate circuit, a separate device, or a separate board from the host system platform. Memory modules 1070 can include multiple memory devices 1040, and the memory modules can include support for multiple separate channels to the included memory devices disposed on them. In another example, memory devices 1040 may be incorporated into the same package as memory controller 1020, such as by techniques such as multi-chip-module (MCM), package-on-package, through-silicon via (TSV), or other techniques or combinations. Similarly, in one example, multiple memory devices 1040 may be incorporated into memory modules 1070, which themselves may be incorporated into the same package as memory controller 1020. It will be appreciated that for these and other implementations, memory controller 1020 may be part of host processor 1010.

Memory devices 1040 each include nonvolatile storage 1060, which represents the individual arrays of memory locations or storage locations for data. Typically, nonvolatile storage 1060 is managed as rows of data, accessed via wordline (rows) and bitline (individual bits within a row) control. Nonvolatile storage 1060 can be organized as separate channels or ranks of memory. Channels refer to independent control paths to storage locations within memory devices 1040. Ranks refer to common locations across multiple memory devices (e.g., same row addresses within different devices).

In one example, memory devices 1040 include one or more registers 1044. Register 1044 represents one or more storage devices or storage locations that provide configuration or settings for the operation of the memory device. In one example, register 1044 can provide a storage location for memory device 1040 to store data for access by memory controller 1020 as part of a control or management operation. In one example, register 1044 includes one or more Mode Registers. In one example, register 1044 includes one or more multipurpose registers. The configuration of locations within register 1044 can configure memory device 1040 to operate in different "modes," where command information can trigger different operations within memory device 1040 based on the mode. Additionally, or in the alternative, different modes can also trigger different operation from address information or other signal lines depending on the mode. Settings of register 1044 can indicate configuration for I/O settings (e.g., timing, termination or ODT (on-die termination), driver configuration, or other I/O settings).

Memory device 1040 includes controller 1050, which represents control logic within the memory device to control internal operations within the memory device. For example, controller 1050 decodes commands sent by memory controller 1020 and generates internal operations to execute or satisfy the commands. Controller 1050 can be referred to as an internal controller, and is separate from memory controller 1020 of the host. Controller 1050 can determine what mode is selected based on register 1044, and configure the internal execution of operations for access to nonvolatile storage 1060 or other operations based on the selected mode. Controller 1050 generates control signals to control the routing of bits within memory device 1040 to provide a proper interface for the selected mode and direct a command to the proper memory locations or addresses. Controller 1050 includes command logic 1052, which can decode command encoding received on command and address signal lines. Thus, command logic 1052 can be or include a command decoder. With command logic 1052, memory device can identify commands and generate internal operations to execute requested commands.

Referring again to memory controller 1020, memory controller 1020 includes command (CMD) logic 1024, which represents logic or circuitry to generate commands to send to memory devices 1040. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 1040, memory controller 1020 can issue commands via I/O 1022 to cause memory device 1040 to execute the commands. In one example, controller 1050 of memory device 1040 receives and decodes command and address information received via I/O 1042 from memory controller 1020. Based on the received command and address information, controller 1050 can control the timing of operations of the logic and circuitry within memory device 1040 to execute the commands. Controller 1050 is responsible for compliance with standards or specifications within memory device 1040, such as timing and signaling requirements. Memory controller 1020 can implement compliance with standards or specifications by access scheduling and control.

Memory controller 1020 includes scheduler 1026, which represents logic or circuitry to generate and order transactions to send to memory device 1040. From one perspective, the primary function of memory controller 1020 could be said to schedule memory access and other transactions to memory device 1040. Such scheduling can include generating the transactions themselves to implement the requests for data by processor 1010 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 1020 typically includes logic such as scheduler 1026 to allow selection and ordering of transactions to improve performance of system 1000. Thus, memory controller 1020 can select which of the outstanding transactions should be sent to memory device 1040 in which order, which is typically achieved with logic much more complex that a simple first-in first-out algorithm. Memory controller 1020 manages the transmission of the transactions to memory device 1040, and manages the timing associated with the transaction. In one example, transactions have deterministic timing, which can be managed by memory controller 1020 and used in determining how to schedule the transactions with scheduler 1026.

Figure 11:
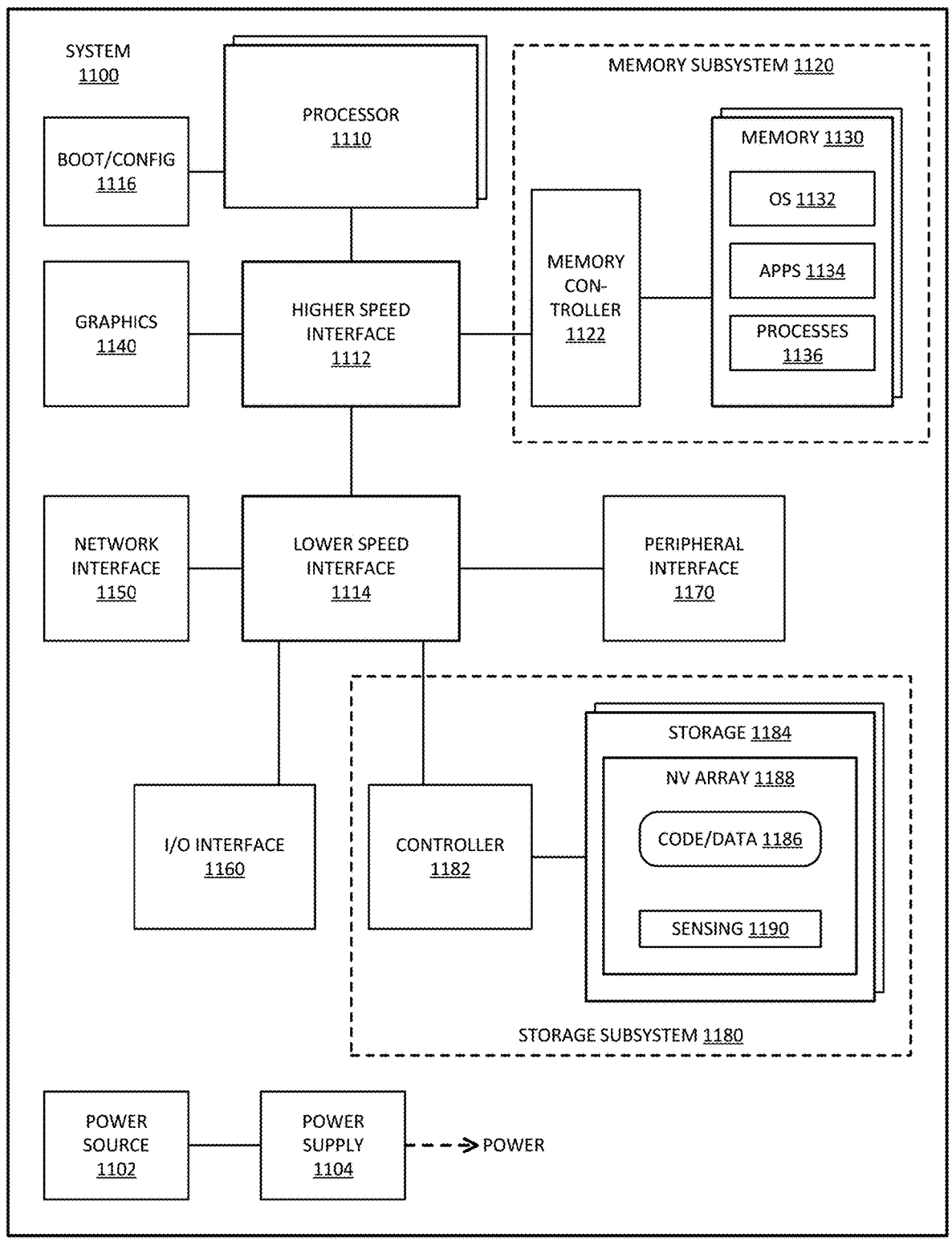
FIG. 11 is a block diagram of an example of a computing system in which a nonvolatile array having sense circuitry that performs SSPC detection can be implemented.

FIG. 11 is a block diagram of an example of a computing system in which a nonvolatile array having sense circuitry that performs SSPC detection can be implemented. System 1100 represents a computing device in accordance with any example herein, and can be a laptop computer, a desktop computer, a tablet computer, a server, a gaming or entertainment control system, embedded computing device, or other electronic device.

System 1100 provides an example of a system that can include an SSD in accordance with system 902 or system 904, or another storage device. In one example, system 1100 includes storage 1184 with NV array 1188. NV array 1188 can be, for example, a 3D NAND array. NV array 1188 includes sensing to represent sensing 1190, which represents sense circuitry for sensing the values stored in the memory cells of the nonvolatile storage array. In one example, controller 1182 implements SSPC cell detection and SSPC boost to enable sensing 1190 to properly read the expected number of SSPC cells, in accordance with what is described above. The detection of SSPC cells and the application of a dynamic SSPC boost voltage based on the number of SSPC cells detected enables system 1100 to adapt to changing conditions within NV array 1188.

System 1100 includes processor 1110 can include any type of microprocessor, central processing unit (CPU), graphics processing unit (GPU), processing core, or other processing hardware, or a combination, to provide processing or execution of instructions for system 1100. Processor 1110 can be a host processor device. Processor 1110 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or a combination of such devices.

System 1100 includes boot/config 1116, which represents storage to store boot code (e.g., basic input/output system (BIOS)), configuration settings, security hardware (e.g., trusted platform module (TPM)), or other system level hardware that operates outside of a host OS. Boot/config 1116 can include a nonvolatile storage device, such as read-only memory (ROM), flash memory, or other memory devices.

In one example, system 1100 includes interface 1112 coupled to processor 1110, which can represent a higher speed interface or a high throughput interface for system components that need higher bandwidth connections, such as memory subsystem 1120 or graphics interface components 1140. Interface 1112 represents an interface circuit, which can be a standalone component or integrated onto a processor die. Interface 1112 can be integrated as a circuit onto the processor die or integrated as a component on a system on a chip. Where present, graphics interface 1140 interfaces to graphics components for providing a visual display to a user of system 1100. Graphics interface 1140 can be a standalone component or integrated onto the processor die or system on a chip. In one example, graphics interface 1140 can drive a high definition (HD) display or ultra high definition (UHD) display that provides an output to a user. In one example, the display can include a touchscreen display. In one example, graphics interface 1140 generates a display based on data stored in memory 1130 or based on operations executed by processor 1110 or both.

Memory subsystem 1120 represents the main memory of system 1100, and provides storage for code to be executed by processor 1110, or data values to be used in executing a routine. Memory subsystem 1120 can include one or more varieties of random-access memory (RAM) such as DRAM or other memory devices, or a combination of such devices. Memory 1130 stores and hosts, among other things, operating system (OS) 1132 to provide a software platform for execution of instructions in system 1100. Additionally, applications 1134 can execute on the software platform of OS 1132 from memory 1130. Applications 1134 represent programs that have their own operational logic to perform execution of one or more functions. Processes 1136 represent agents or routines that provide auxiliary functions to OS 1132 or one or more applications 1134 or a combination. OS 1132, applications 1134, and processes 1136 provide software logic to provide functions for system 1100. In one example, memory subsystem 1120 includes memory controller 1122, which is a memory controller to generate and issue commands to memory 1130. It will be understood that memory controller 1122 could be a physical part of processor 1110 or a physical part of interface 1112. For example, memory controller 1122 can be an integrated memory controller, integrated onto a circuit with processor 1110, such as integrated onto the processor die or a system on a chip.

While not specifically illustrated, it will be understood that system 1100 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1100 includes interface 1114, which can be coupled to interface 1112. Interface 1114 can be a lower speed interface than interface 1112. In one example, interface 1114 represents an interface circuit, which can include standalone components and integrated circuitry. In one example, multiple user interface components or peripheral components, or both, couple to interface 1114. Network interface 1150 provides system 1100 the ability to communicate with remote devices (e.g., servers or other computing devices) over one or more networks. Network interface 1150 can include an Ethernet adapter, wireless interconnection components, cellular network interconnection components, USB (universal serial bus), or other wired or wireless standards-based or proprietary interfaces. Network interface 1150 can exchange data with a remote device, which can include sending data stored in memory or receiving data to be stored in memory.

In one example, system 1100 includes one or more input/output (I/O) interface(s) 1160. I/O interface 1160 can include one or more interface components through which a user interacts with system 1100 (e.g., audio, alphanumeric, tactile/touch, or other interfacing). Peripheral interface 1170 can include any hardware interface not specifically mentioned above. Peripherals refer generally to devices that connect dependently to system 1100. A dependent connection is one where system 1100 provides the software platform or hardware platform or both on which operation executes, and with which a user interacts.

In one example, system 1100 includes storage subsystem 1180 to store data in a nonvolatile manner. In one example, in certain system implementations, at least certain components of storage 1180 can overlap with components of memory subsystem 1120. Storage subsystem 1180 includes storage device(s) 1184, which can be or include any conventional medium for storing large amounts of data in a nonvolatile manner, such as one or more magnetic, solid state, or optical based disks, or a combination. Storage 1184 holds code or instructions and data 1186 in a persistent state (i.e., the value is retained despite interruption of power to system 1100). Storage 1184 can be generically considered to be a "memory," although memory 1130 is typically the executing or operating memory to provide instructions to processor 1110. Whereas storage 1184 is nonvolatile, memory 1130 can include volatile memory (i.e., the value or state of the data is indeterminate if power is interrupted to system 1100). In one example, storage subsystem 1180 includes controller 1182 to interface with storage 1184. In one example controller 1182 is a physical part of interface 1114 or processor 1110, or can include circuits or logic in both processor 1110 and interface 1114.

Power source 1102 provides power to the components of system 1100. More specifically, power source 1102 typically interfaces to one or multiple power supplies 1104 in system 1100 to provide power to the components of system 1100. In one example, power supply 1104 includes an AC to DC (alternating current to direct current) adapter to plug into a wall outlet. Such AC power can be renewable energy (e.g., solar power) power source 1102. In one example, power source 1102 includes a DC power source, such as an external AC to DC converter. In one example, power source 1102 or power supply 1104 includes wireless charging hardware to charge via proximity to a charging field. In one example, power source 1102 can include an internal battery or fuel cell source.

Figure 12:
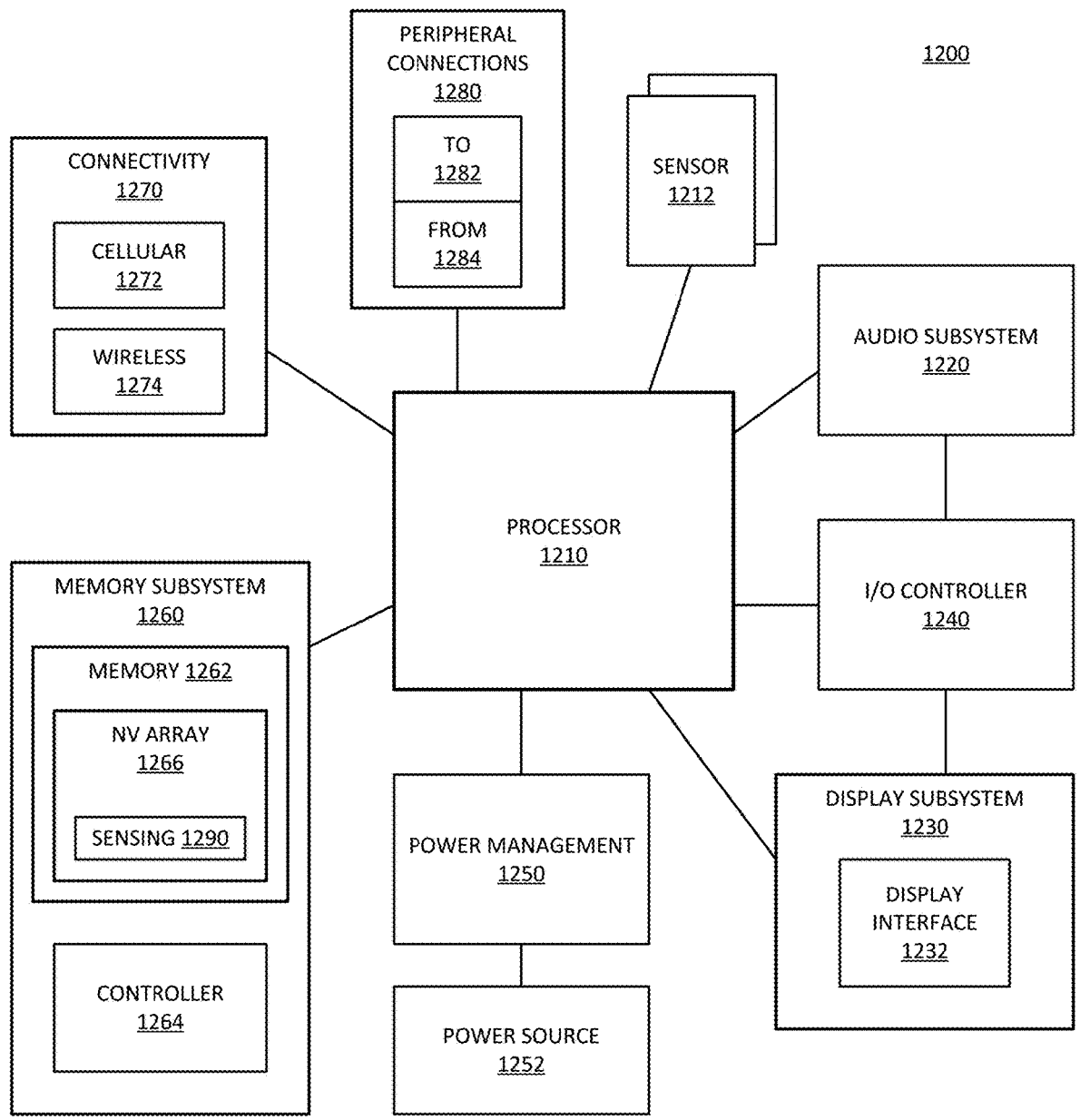
FIG. 12 is a block diagram of an example of a mobile device in which a nonvolatile array having sense circuitry that performs SSPC detection can be implemented.

FIG. 12 is a block diagram of an example of a mobile device in which a nonvolatile array having sense circuitry that performs SSPC detection can be implemented. System 1200 represents a mobile computing device, such as a computing tablet, a mobile phone or smartphone, wearable computing device, or other mobile device, or an embedded computing device. It will be understood that certain of the components are shown generally, and not all components of such a device are shown in system 1200.

System 1200 provides an example of a system that can include an SSD in accordance with system 902 or system 904, or another storage device. In one example, system 1200 includes memory 1262 with NV array 1266. NV array 1266 can be, for example, a 3D NAND array. NV array 1266 includes sensing to represent sensing 1290, which represents sense circuitry for sensing the values stored in the memory cells of the nonvolatile storage array. In one example, controller 1264 implements SSPC cell detection and SSPC boost to enable sensing 1290 to properly read the expected number of SSPC cells, in accordance with what is described above. The detection of SSPC cells and the application of a dynamic SSPC boost voltage based on the number of SSPC cells detected enables system 1200 to adapt to changing conditions within NV array 1266.

System 1200 includes processor 1210, which performs the primary processing operations of system 1200. Processor 1210 can be a host processor device. Processor 1210 can include one or more physical devices, such as microprocessors, application processors, microcontrollers, programmable logic devices, or other processing means. The processing operations performed by processor 1210 include the execution of an operating platform or operating system on which applications and device functions are executed. The processing operations include operations related to I/O (input/output) with a human user or with other devices, operations related to power management, operations related to connecting system 1200 to another device, or a combination. The processing operations can also include operations related to audio I/O, display I/O, or other interfacing, or a combination. Processor 1210 can execute data stored in memory. Processor 1210 can write or edit data stored in memory.

In one example, system 1200 includes one or more sensors 1212. Sensors 1212 represent embedded sensors or interfaces to external sensors, or a combination. Sensors 1212 enable system 1200 to monitor or detect one or more conditions of an environment or a device in which system 1200 is implemented. Sensors 1212 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1212 can also include sensors for biometric systems such as fingerprint recognition systems, face detection or recognition systems, or other systems that detect or recognize user features. Sensors 1212 should be understood broadly, and not limiting on the many different types of sensors that could be implemented with system 1200. In one example, one or more sensors 1212 couples to processor 1210 via a frontend circuit integrated with processor 1210. In one example, one or more sensors 1212 couples to processor 1210 via another component of system 1200.

In one example, system 1200 includes audio subsystem 1220, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1200, or connected to system 1200. In one example, a user interacts with system 1200 by providing audio commands that are received and processed by processor 1210.

Display subsystem 1230 represents hardware (e.g., display devices) and software components (e.g., drivers) that provide a visual display for presentation to a user. In one example, the display includes tactile components or touchscreen elements for a user to interact with the computing device. Display subsystem 1230 includes display interface 1232, which includes the particular screen or hardware device used to provide a display to a user. In one example, display interface 1232 includes logic separate from processor 1210 (such as a graphics processor) to perform at least some processing related to the display. In one example, display subsystem 1230 includes a touchscreen device that provides both output and input to a user. In one example, display subsystem 1230 includes a high definition (HD) or ultra-high definition (UHD) display that provides an output to a user. In one example, display subsystem includes or drives a touchscreen display. In one example, display subsystem 1230 generates display information based on data stored in memory or based on operations executed by processor 1210 or both.

I/O controller 1240 represents hardware devices and software components related to interaction with a user. I/O controller 1240 can operate to manage hardware that is part of audio subsystem 1220, or display subsystem 1230, or both. Additionally, I/O controller 1240 illustrates a connection point for additional devices that connect to system 1200 through which a user might interact with the system. For example, devices that can be attached to system 1200 might include microphone devices, speaker or stereo systems, video systems or other display device, keyboard or keypad devices, buttons/switches, or other I/O devices for use with specific applications such as card readers or other devices.

As mentioned above, I/O controller 1240 can interact with audio subsystem 1220 or display subsystem 1230 or both. For example, input through a microphone or other audio device can provide input or commands for one or more applications or functions of system 1200. Additionally, audio output can be provided instead of or in addition to display output. In another example, if display subsystem includes a touchscreen, the display device also acts as an input device, which can be at least partially managed by I/O controller 1240. There can also be additional buttons or switches on system 1200 to provide I/O functions managed by I/O controller 1240.

In one example, I/O controller 1240 manages devices such as accelerometers, cameras, light sensors or other environmental sensors, gyroscopes, global positioning system (GPS), or other hardware that can be included in system 1200, or sensors 1212. The input can be part of direct user interaction, as well as providing environmental input to the system to influence its operations (such as filtering for noise, adjusting displays for brightness detection, applying a flash for a camera, or other features).

In one example, system 1200 includes power management 1250 that manages battery power usage, charging of the battery, and features related to power saving operation. Power management 1250 manages power from power source 1252, which provides power to the components of system 1200. In one example, power source 1252 includes an AC to DC (alternating current to direct current) adapter to plug into a wall outlet. Such AC power can be renewable energy (e.g., solar power, motion based power). In one example, power source 1252 includes only DC power, which can be provided by a DC power source, such as an external AC to DC converter. In one example, power source 1252 includes wireless charging hardware to charge via proximity to a charging field. In one example, power source 1252 can include an internal battery or fuel cell source.

Memory subsystem 1260 includes memory device(s) 1262 for storing information in system 1200. Memory subsystem 1260 can include nonvolatile (state does not change if power to the memory device is interrupted) or volatile (state is indeterminate if power to the memory device is interrupted) memory devices, or a combination. Memory 1260 can store application data, user data, music, photos, documents, or other data, as well as system data (whether long-term or temporary) related to the execution of the applications and functions of system 1200. In one example, memory subsystem 1260 includes memory controller 1264 (which could also be considered part of the control of system 1200, and could potentially be considered part of processor 1210). Memory controller 1264 includes a scheduler to generate and issue commands to control access to memory device 1262.

Connectivity 1270 includes hardware devices (e.g., wireless or wired connectors and communication hardware, or a combination of wired and wireless hardware) and software components (e.g., drivers, protocol stacks) to enable system 1200 to communicate with external devices. The external device could be separate devices, such as other computing devices, wireless access points or base stations, as well as peripherals such as headsets, printers, or other devices. In one example, system 1200 exchanges data with an external device for storage in memory or for display on a display device. The exchanged data can include data to be stored in memory, or data already stored in memory, to read, write, or edit data.

Connectivity 1270 can include multiple different types of connectivity. To generalize, system 1200 is illustrated with cellular connectivity 1272 and wireless connectivity 1274. Cellular connectivity 1272 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1274 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1280 include hardware interfaces and connectors, as well as software components (e.g., drivers, protocol stacks) to make peripheral connections. It will be understood that system 1200 could both be a peripheral device ("to" 1282) to other computing devices, as well as have peripheral devices ("from" 1284) connected to it. System 1200 commonly has a "docking" connector to connect to other computing devices for purposes such as managing (e.g., downloading, uploading, changing, synchronizing) content on system 1200. Additionally, a docking connector can allow system 1200 to connect to certain peripherals that allow system 1200 to control content output, for example, to audiovisual or other systems.

In addition to a proprietary docking connector or other proprietary connection hardware, system 1200 can make peripheral connections 1280 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example an apparatus includes: a nonvolatile (NV) storage media to be written by an operation to program a cell and then perform program verify of the cell, the NV storage media to be written as a page of cells; and a controller to perform program verify with a first wordline (WL) select voltage for SSPC (selective slow programming convergence) cell detection for a first write of the page of cells to detect an expected number of SSPC cells, and perform program verify with a second WL select voltage higher than the first WL select voltage for subsequent writes of the page of cells, to perform program verify for standard cells and then SSPC program verify with a boost voltage determined from the first write to capture approximately the expected number of SSPC cells.

In one example of the apparatus, in one example, the first WL select voltage comprises a voltage approximately one-half a program step voltage lower than a WL program voltage. In accordance with any preceding example of the apparatus, in one example, the apparatus includes: a boost circuit to generate the boost voltage, including to generate a sequence of SSPC boost voltages to determine the boost voltage to capture approximately the expected number of SSPC cells. In accordance with any preceding example of the apparatus, in one example, the sequence of SSPC boost voltages comprises a linear search sequence. In accordance with any preceding example of the apparatus, in one example, the sequence of SSPC boost voltages comprises a binary search sequence. In accordance with any preceding example of the apparatus, in one example, the controller is to compute the boost voltage to capture approximately the expected number of SSPC cells based on the expected number of SSPC cells for a changed condition for the NV storage media. In accordance with any preceding example of the apparatus, in one example, the changed condition comprises a temperature change. In accordance with any preceding example of the apparatus, in one example, the changed condition comprises a different wordline position. In accordance with any preceding example of the apparatus, in one example, the changed condition comprises a change in cycling count. In accordance with any preceding example of the apparatus, in one example, the cell comprises a 3D (three-dimensional) NAND memory cell.

In general with respect to the descriptions herein, in one example a system includes: a processor; a solid state drive (SSD) coupled to the processor, the SSD including a nonvolatile (NV) storage media to be written by an operation to program a cell and then perform program verify of the cell, the NV storage media to be written as a page of cells; and a controller to perform program verify with a first wordline (WL) select voltage for SSPC (selective slow programming convergence) cell detection for a first write of the page of cells to detect an expected number of SSPC cells, and perform program verify with a second WL select voltage higher than the first WL select voltage for subsequent writes of the page of cells, to perform program verify for standard cells and then SSPC program verify with a boost voltage determined from the first write to capture approximately the expected number of SSPC cells.

In one example of the system, in one example, the first WL select voltage comprises a voltage approximately one-half a program step voltage lower than a WL program voltage. In accordance with any preceding example of the system, in one example, the system includes: a boost circuit to generate the boost voltage, including to generate a sequence of SSPC boost voltages to determine the boost voltage to capture approximately the expected number of SSPC cells. In accordance with any preceding example of the system, in one example, the sequence of SSPC boost voltages comprises a linear search sequence. In accordance with any preceding example of the system, in one example, the sequence of SSPC boost voltages comprises a binary search sequence. In accordance with any preceding example of the system, in one example, the controller is to compute the boost voltage to capture approximately the expected number of SSPC cells based on the expected number of SSPC cells for a changed condition for the NV storage media. In accordance with any preceding example of the system, in one example, the changed condition comprises a temperature change. In accordance with any preceding example of the system, in one example, the changed condition comprises a different wordline position. In accordance with any preceding example of the system, in one example, the changed condition comprises a change in cycling count. In accordance with any preceding example of the system, in one example, the cell comprises a 3D (three-dimensional) NAND memory cell.

In general with respect to the descriptions herein, in one example a method for program verify of a cell includes: performing program verify with a first wordline (WL) select voltage for SSPC (selective slow programming convergence) cell detection for a first write of a page of cells of a nonvolatile (NV) storage media, to detect an expected number of SSPC cells; and performing program verify with a second WL select voltage higher than the first WL select voltage for subsequent writes of the page of cells, to perform program verify for standard cells and then SSPC program verify with a boost voltage determined from the first write to capture approximately the expected number of SSPC cells.

In one example of the method, in one example, the first WL select voltage comprises a voltage approximately one-half a program step voltage lower than a WL program voltage. In accordance with any preceding example of the method, in one example, the method includes: generating the boost voltage, including generating a sequence of SSPC boost voltages to determine the boost voltage to capture approximately the expected number of SSPC cells. In accordance with any preceding example of the method, in one example, the sequence of SSPC boost voltages comprises a linear search sequence. In accordance with any preceding example of the method, in one example, the sequence of SSPC boost voltages comprises a binary search sequence. In accordance with any preceding example of the method, in one example, the method includes computing the boost voltage to capture approximately the expected number of SSPC cells based on the expected number of SSPC cells for a changed condition for the NV storage media. In accordance with any preceding example of the method, in one example, the changed condition comprises a temperature change. In accordance with any preceding example of the method, in one example, the changed condition comprises a different wordline position. In accordance with any preceding example of the method, in one example, the changed condition comprises a change in cycling count. In accordance with any preceding example of the method, in one example, the cell comprises a 3D (three-dimensional) NAND memory cell.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
a nonvolatile (NV) storage media to be written by an operation to program a cell and then perform program verify of the cell, the NV storage media to be written as a page of cells; and
a controller to perform program verify with a first wordline (WL) select voltage for SSPC (selective slow programming convergence) cell detection for a first write of the page of cells to detect an expected number of SSPC cells, compute a boost voltage to capture approximately the expected number of SSPC cells, and perform program verify with a second WL select voltage higher than the first WL select voltage for subsequent writes of the page of cells, to perform program verify for standard cells and then SSPC program verify with the boost voltage computed to capture approximately the expected number of SSPC cells.

2. The apparatus of claim 1, wherein the first WL select voltage comprises a voltage approximately one-half a program step voltage lower than a WL program voltage.

3. The apparatus of claim 1, further comprising:
a boost circuit to generate the boost voltage, including to generate a sequence of SSPC boost voltages to determine the boost voltage to capture approximately the expected number of SSPC cells.

4. The apparatus of claim 3, wherein the sequence of SSPC boost voltages comprises a linear search sequence.

5. The apparatus of claim 3, wherein the sequence of SSPC boost voltages comprises a binary search sequence.

6. The apparatus of claim 1, wherein the controller is to compute the boost voltage to capture approximately the expected number of SSPC cells based on the expected number of SSPC cells for a changed condition for the NV storage media.

7. The apparatus of claim 6, wherein the changed condition comprises a temperature change.

8. The apparatus of claim 6, wherein the changed condition comprises a different wordline position.

9. The apparatus of claim 6, wherein the changed condition comprises a change in cycling count.

10. The apparatus of claim 1, wherein the cell comprises a 3D (three-dimensional) NAND memory cell.

11. A system comprising:
a processor;
a solid state drive (SSD) coupled to the processor, the SSD including
a nonvolatile (NV) storage media to be written by an operation to program a cell and then perform program verify of the cell, the NV storage media to be written as a page of cells; and
a controller to perform program verify with a first wordline (WL) select voltage for SSPC (selective slow programming convergence) cell detection for a first write of the page of cells to detect an expected number of SSPC cells, compute a boost voltage to capture approximately the expected number of SSPC cells, and perform program verify with a second WL select voltage higher than the first WL select voltage for subsequent writes of the page of cells, to perform program verify for standard cells and then SSPC program verify with the boost voltage computed to capture approximately the expected number of SSPC cells.

12. The system of claim 11, wherein the first WL select voltage comprises a voltage approximately one-half a program step voltage lower than a WL program voltage.

13. The system of claim 11, the SSD further including:
a boost circuit to generate the boost voltage, including to generate a sequence of SSPC boost voltages to determine the boost voltage to capture approximately the expected number of SSPC cells.

14. The system of claim 13, wherein the sequence of SSPC boost voltages comprises a linear search sequence.

15. The system of claim 13, wherein the sequence of SSPC boost voltages comprises a binary search sequence.

16. The system of claim 11, wherein the controller is to compute the boost voltage to capture approximately the expected number of SSPC cells based on the expected number of SSPC cells for a temperature change, a different wordline position, or a change in cycling count for the NV storage media.

17. The system of claim 11, wherein the cell comprises a 3D (three-dimensional) NAND memory cell.

18. A method for program verify of a cell, comprising:
performing program verify with a first wordline (WL) select voltage for SSPC (selective slow programming convergence) cell detection for a first write of a page of cells of a nonvolatile (NV) storage media, to detect an expected number of SSPC cells; and
computing a boost voltage to capture approximately the expected number of SSPC cells; and
performing program verify with a second WL select voltage higher than the first WL select voltage for subsequent writes of the page of cells, to perform program verify for standard cells and then SSPC program verify with the boost voltage computed to capture approximately the expected number of SSPC cells.

19. The method of claim 18, further comprising:
generating the boost voltage, including generating a sequence of SSPC boost voltages to determine the boost voltage to capture approximately the expected number of SSPC cells.

20. The method of claim 18, further comprising:
computing the boost voltage to capture approximately the expected number of SSPC cells based on the expected number of SSPC cells for a temperature change, a different wordline position, or a change in cycling count for the NV storage media.

21. The method of claim 20, wherein computing the boost voltage comprises performing a linear search sequence or performing a binary search sequence.

* * * * *